(12) United States Patent
Saito et al.

(10) Patent No.: US 8,509,278 B2
(45) Date of Patent: Aug. 13, 2013

(54) LIGHT EMITTING DEVICE AND OPTICAL APPARATUS USING THE SAME

(75) Inventors: Kazunari Saito, Tokyo (JP); Noriyuki Banno, Miyagi (JP); Kota Tokuda, Kanagawa (JP)

(73) Assignee: Sony Corporation, Tokyo (JP)

( * ) Notice: Subject to any disclaimer, the term of this patent is extended or adjusted under 35 U.S.C. 154(b) by 111 days.

(21) Appl. No.: 12/929,657

(22) Filed: Feb. 7, 2011

(65) Prior Publication Data

US 2011/0211610 A1 Sep. 1, 2011

(30) Foreign Application Priority Data

Mar. 1, 2010 (JP) ................................. 2010-044558

(51) Int. Cl.
*H01S 5/00* (2006.01)
(52) U.S. Cl.
USPC ............... 372/50.121; 372/43.01; 372/45.01
(58) Field of Classification Search
USPC ............................................ 372/23, 50.121
See application file for complete search history.

(56) References Cited

U.S. PATENT DOCUMENTS

| 6,956,322 | B2 | 10/2005 | Ikeda | |
|---|---|---|---|---|
| 7,106,770 | B2* | 9/2006 | Seki | 372/43.01 |
| 2004/0109481 | A1* | 6/2004 | Ikeda | 372/36 |
| 2004/0136428 | A1* | 7/2004 | Miyachi et al. | 372/50 |
| 2005/0025205 | A1* | 2/2005 | Ryowa et al. | 372/44 |

FOREIGN PATENT DOCUMENTS

JP 2001-230502 8/2001

\* cited by examiner

*Primary Examiner* — Jessica Stultz
*Assistant Examiner* — Xinning Niu
(74) *Attorney, Agent, or Firm* — Rader, Fishman & Grauer PLLC

(57) ABSTRACT

A light emitting device includes: a support base; a first light emitting element which is provided at one surface side of the support base and has a first substrate; and a second light emitting element which is provided between the first light emitting element and the support base and has a second substrate, which has a light emitting section as a semiconductor layer and a peripheral section other than the light emitting section at the first light emitting element side of the second substrate, and which has an embedded layer formed of a material with higher heat conductivity than the semiconductor layer in the peripheral section.

23 Claims, 16 Drawing Sheets

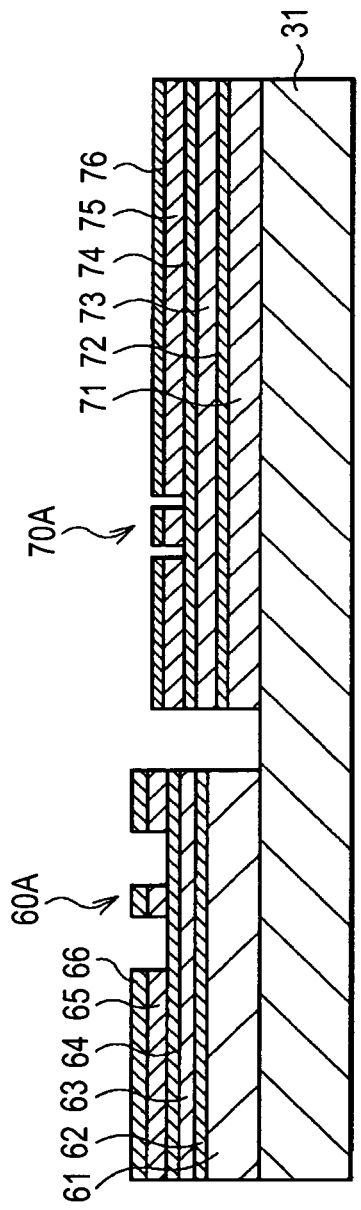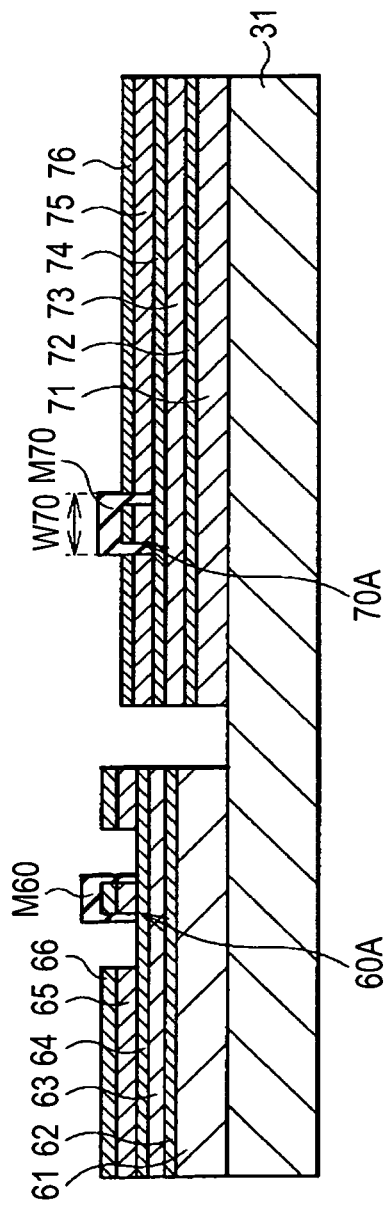

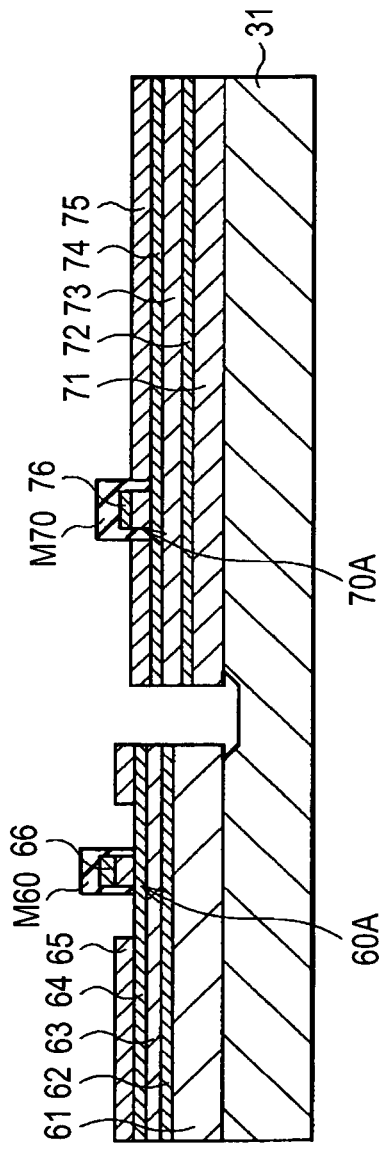
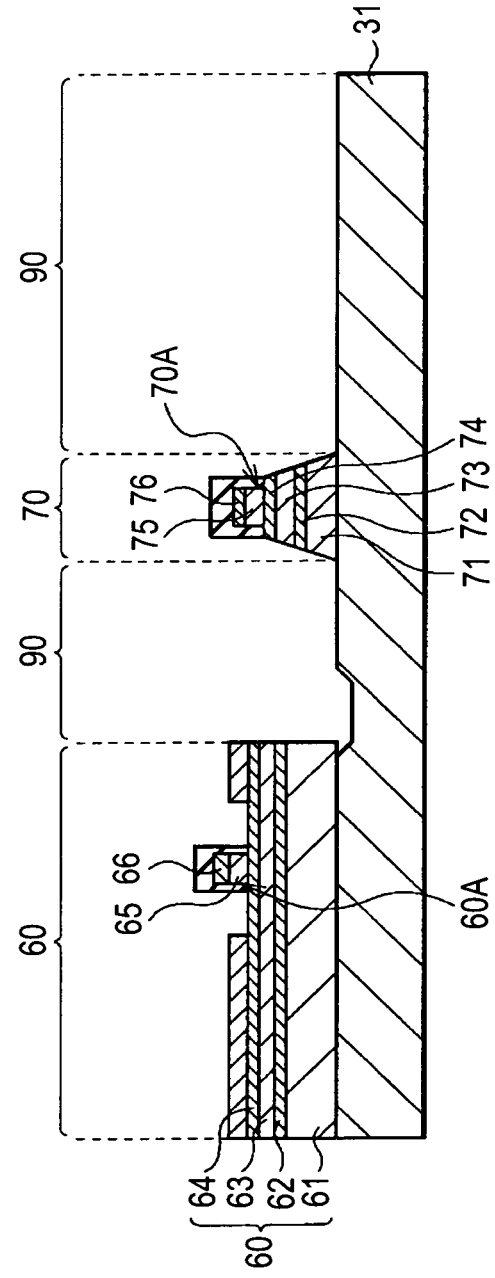

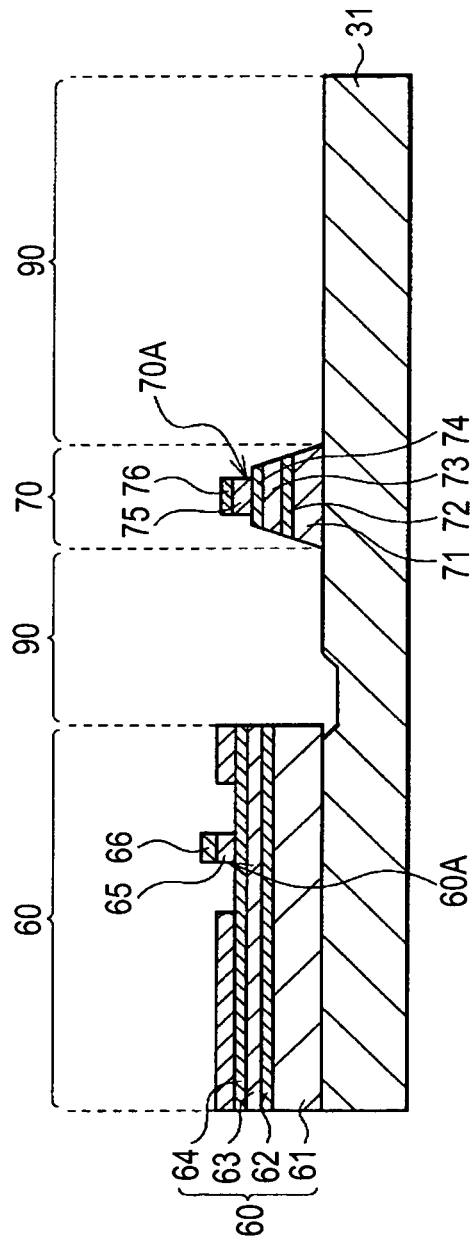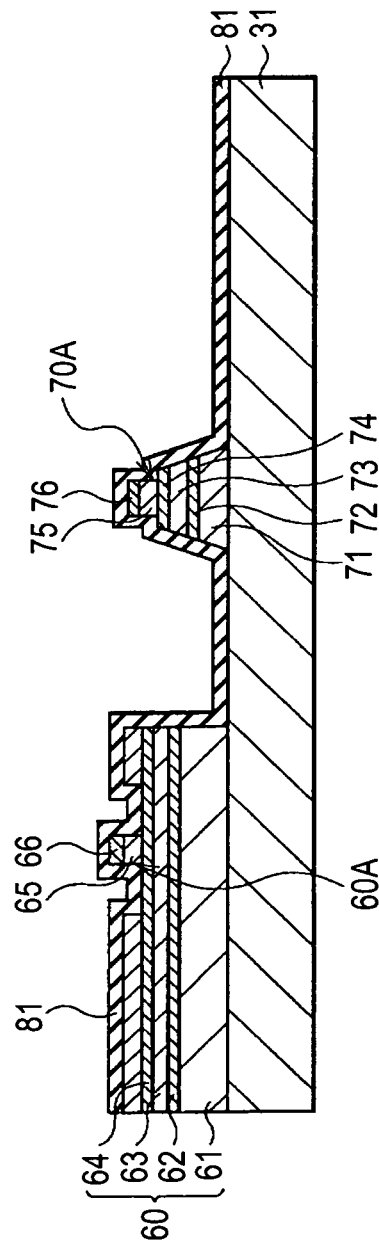

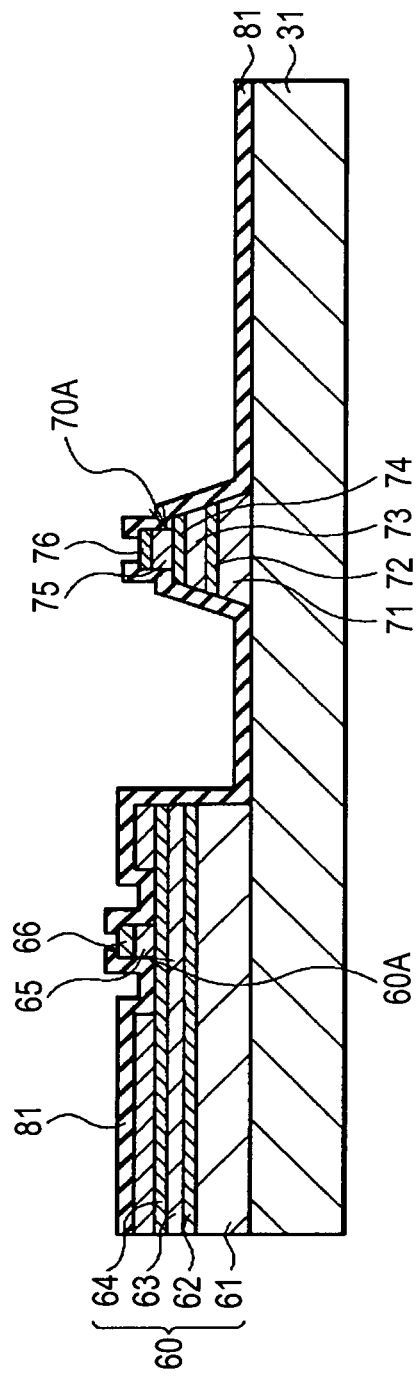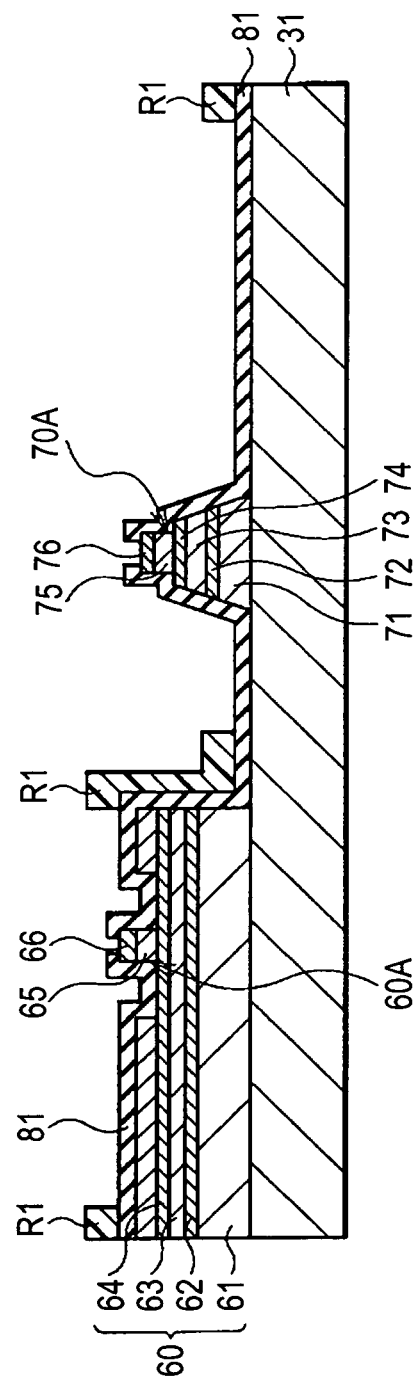

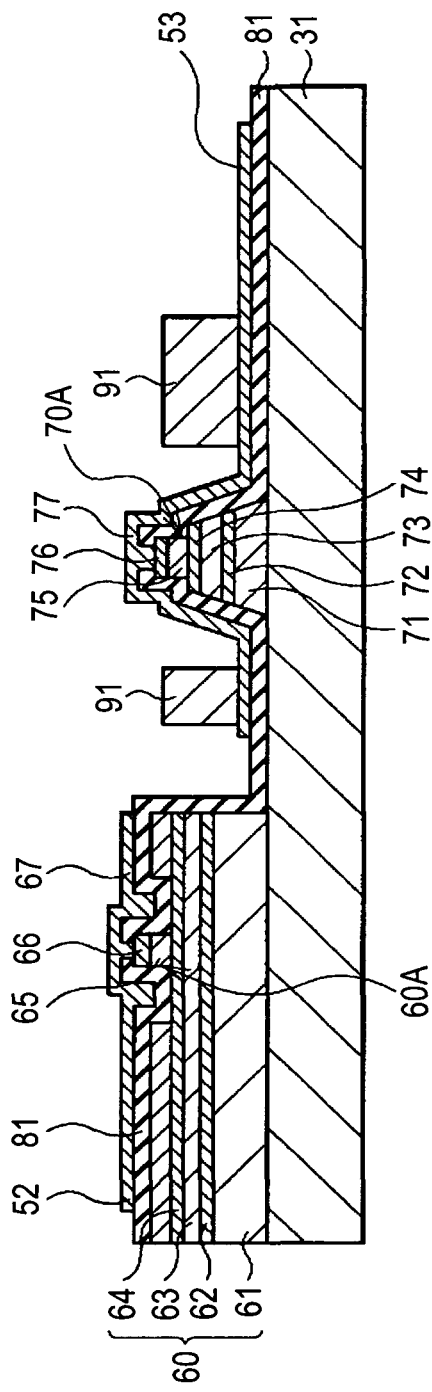
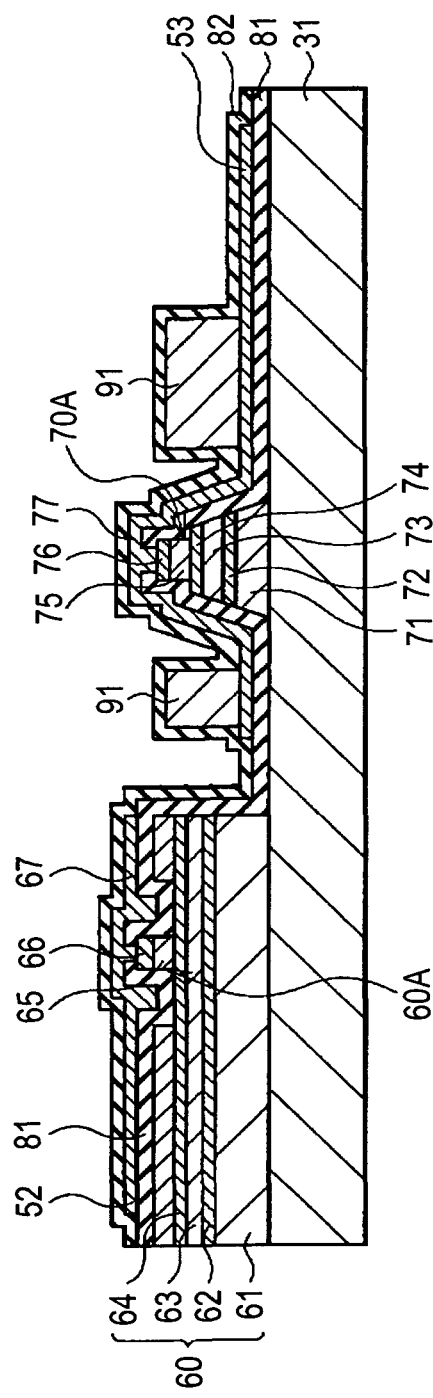
FIG.11A
FIG.11B

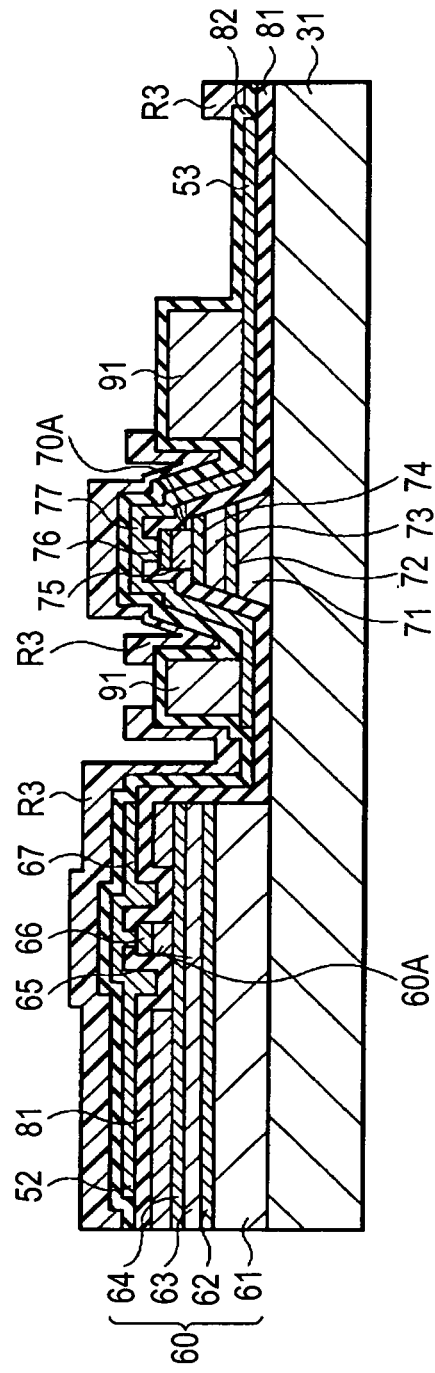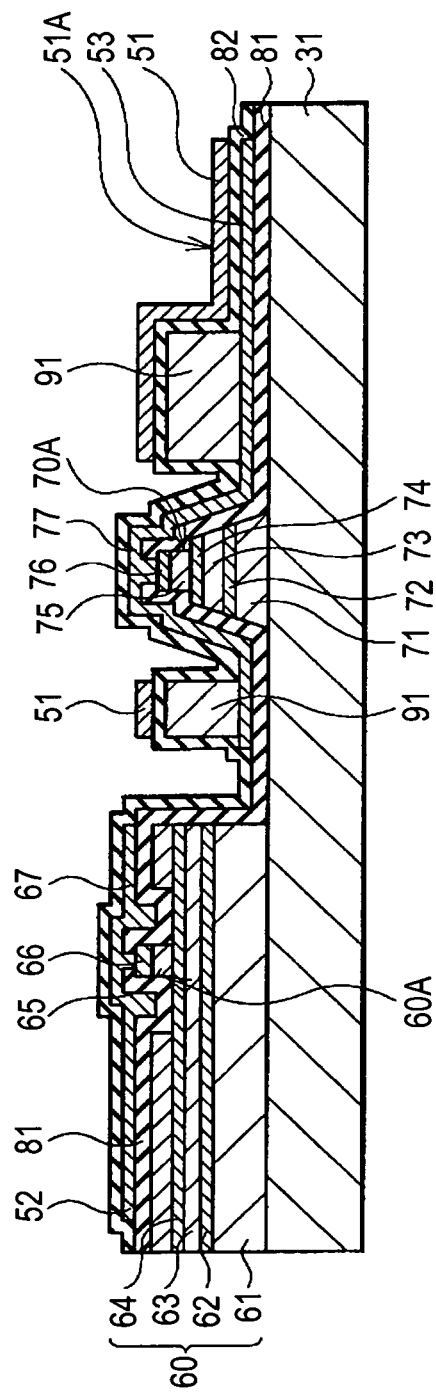

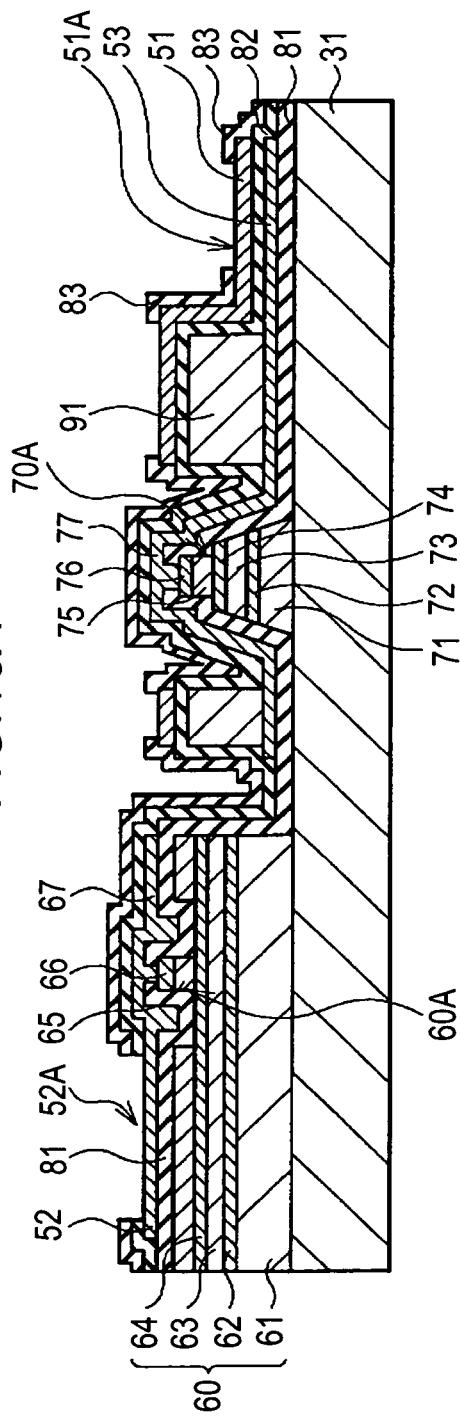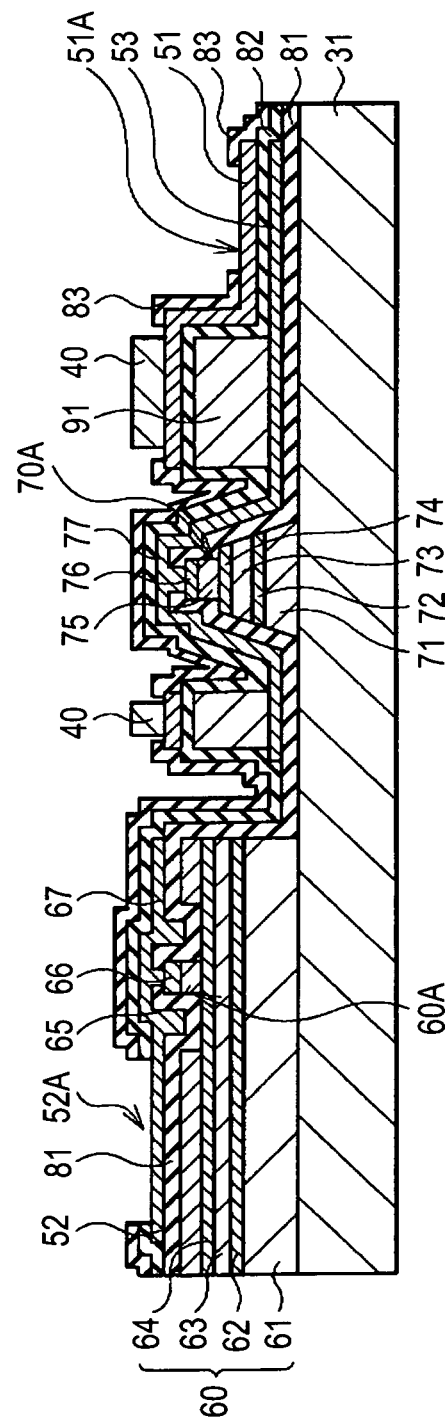

LIGHT EMITTING DEVICE AND OPTICAL APPARATUS USING THE SAME

BACKGROUND OF THE INVENTION

1. Field of the Invention

The present invention relates to a light emitting device having a plurality of light emitting elements and an optical apparatus using the light emitting device.

2. Description of the Related Art

In recent years, in the field of a light emitting device, a semiconductor laser (LD; laser diode) (hereinafter, referred to as a multi-wavelength laser) in which a plurality of light emitting sections, which emit light beams with different wavelengths, are formed on the same substrate (or the same base) has been actively developed. As an example of such a multi-wavelength laser, there is a laser in which a plurality of light emitting sections that emit light beams with different wavelengths are formed in one chip (so-called monolithic multi-wavelength laser). In this multi-wavelength laser, for example, a first laser oscillating section, which is formed by growing an AlGaAs-based semiconductor material by vapor deposition, and a second laser oscillating section, which is formed by growing an AlGaInP-based semiconductor material, are disposed in parallel at one surface side of a substrate, which is formed of GaAs (gallium arsenide), with a separation groove interposed therebetween. In this case, the oscillation wavelength of the first laser oscillating section is a 700 nm-band wavelength (for example, 780 nm), and the oscillation wavelength of the second laser oscillating section is a 600 nm-band wavelength (for example, 650 nm).

Moreover, for example, a laser in which a plurality of semiconductor lasers that emit light beams with different wavelengths are mounted in parallel on an arrangement base (so-called hybrid multi-wavelength laser) has also been proposed. However, the so-called monolithic laser described above is more effective in a point that the distance between light emitting points can be controlled with high precision.

These multi-wavelength lasers are used, for example, as laser light sources of optical disc apparatuses. Currently, in optical disc apparatuses, 700 nm-band semiconductor laser light is generally used for reproduction of a Compact Disc (CD) and used for recording and reproduction of recordable optical discs of a CD recordable (CD-R), a CD Rewritable (CD-RW), a Mini Disc (MD), and the like. In addition, 600 nm-band semiconductor laser light is used for recording and reproduction of a Digital Versatile Disc (DVD). Accordingly, by mounting the above-described multi-wavelength laser in an optical disc apparatus, recording or reproduction becomes also possible for a plurality of kinds of known optical discs. In addition, since the first and second laser oscillating sections are disposed in parallel on the same substrate (on the same arrangement base in a so-called hybrid semiconductor laser), only one package for a laser light source is made. Accordingly, since the number of components, such as an objective lens and a beam splitter for recording and reproduction of various kinds of optical discs, in an optical system can be reduced, the configuration of the optical system can be simplified. As a result, an optical disc apparatus can be made small at low cost.

In recent years, however, there has been a demand for higher density of an optical disc using a semiconductor laser which emits light with a shorter wavelength. As a constituent material of a semiconductor laser which meets such a demand, nitride-based Group III-V compound semiconductor (hereinafter, also referred to as GaN-based semiconductor) represented by GaN, an AlGaN mixed crystal and GaInN mixed crystal is known. A semiconductor laser using this GaN-based semiconductor can emit light with an oscillation wavelength of around 400 nm, which is a wavelength limit of an optical disc for which recording and reproduction are possible using a known optical system. Accordingly, it has been drawing much attention as a light source of a recording and reproduction apparatus for a next-generation optical disc. Moreover, it is also expected as a light source of a full-color display using three primary colors of RGB. For this reason, there is a demand for the development of a multi-wavelength laser including a GaN-based laser oscillating section.

As a known example of a multi-wavelength laser having a GaN-based laser oscillating section, a multi-wavelength laser has been proposed in which a first light emitting element having a GaN-based laser oscillating section and a monolithic second light emitting element, in which an AlGaAs-based first laser oscillating section and an AlGaInP-based second laser oscillating section are disposed in parallel at one surface side of a substrate, are laminated in this order on a support base (for example, refer to JP-A-2001-230502).

SUMMARY OF THE INVENTION

In such a known multi-wavelength laser, it is desirable that the second light emitting element using a substrate formed of GaAs is used as a base and the first light emitting element having the GaN-based laser oscillating section is laminated on the second light emitting element so as to overlap it from the point of view of cost reduction. This is because it is necessary to increase the size of a semiconductor laser chip as a base since a larger area is necessary in order to form an electrode wiring and the like and accordingly, using a substrate formed of inexpensive GaAs as a base chip is advantageous for cost reduction. In this case, however, the AlGaAs-based and AlGaInP-based semiconductor layers with low heat conductivity of the second light emitting element adversely affect the heat dissipation path when heat generated in the GaN-based laser oscillating section is transmitted to the support base. This problem has not yet been solved.

In view of the above, it is desirable to provide a light emitting device capable of improving the heat dissipation property and an optical apparatus using the light emitting device.

According to an embodiment of the present invention, there is provided a light emitting device including: a support base; a first light emitting element which is provided at one surface side of the support base and has a first substrate; and a second light emitting element which is provided between the first light emitting element and the support base and has a second substrate, which has a light emitting section as a semiconductor layer and a peripheral section other than the light emitting section at the first light emitting element side of the second substrate, and which has an embedded layer formed of a material with higher heat conductivity than the semiconductor layer in the peripheral section.

According to another embodiment of the present invention, there is provided an optical apparatus including the light emitting device described above.

In the light emitting device or the optical apparatus according to the embodiment of the present invention, the embedded layer formed of a material with higher heat conductivity than the semiconductor layer is provided in the peripheral section of the second substrate excluding the light emitting section. Accordingly, heat generated in the first light emitting element is transmitted to the support base through the embedded layer with high heat conductivity. As a result, the heat dissipation property is improved.

According to the light emitting device or the optical apparatus according to the embodiment of the present invention, it is possible to improve the heat dissipation property since the embedded layer formed of a material with higher heat conductivity than the semiconductor layer is provided in the peripheral section of the second substrate excluding the light emitting section. In particular, this is suitable for a case where a light emitting element with low heat conductivity among a plurality of light emitting elements is used as a base.

BRIEF DESCRIPTION OF THE DRAWINGS

FIGS. 6A and 6B are cross-sectional views for explaining a method of manufacturing the light emitting device shown in FIG. 1;

FIGS. 7A and 7B are cross-sectional views for explaining the manufacturing process subsequent to FIGS. 6A and 6B;

FIGS. 8A and 8B are cross-sectional views for explaining the manufacturing process subsequent to FIGS. 7A and 7B;

FIGS. 9A and 9B are cross-sectional views for explaining the manufacturing process subsequent to FIGS. 8A and 8B;

FIGS. 11A and 11B are cross-sectional views for explaining the manufacturing process subsequent to FIGS. 10A and 10B;

FIGS. 12A and 12B are cross-sectional views for explaining the manufacturing process subsequent to FIGS. 11A and 11B;

FIGS. 13A and 13B are cross-sectional views for explaining the manufacturing process subsequent to FIGS. 12A and 12B;

DESCRIPTION OF THE PREFERRED EMBODIMENTS

Hereinafter, embodiments of the present invention will be described in detail with reference to the accompanying drawings. In addition, the explanation will be given in the following order.
1. Embodiments
2. Applications (optical disc recording and reproduction apparatus)

Figure 1:
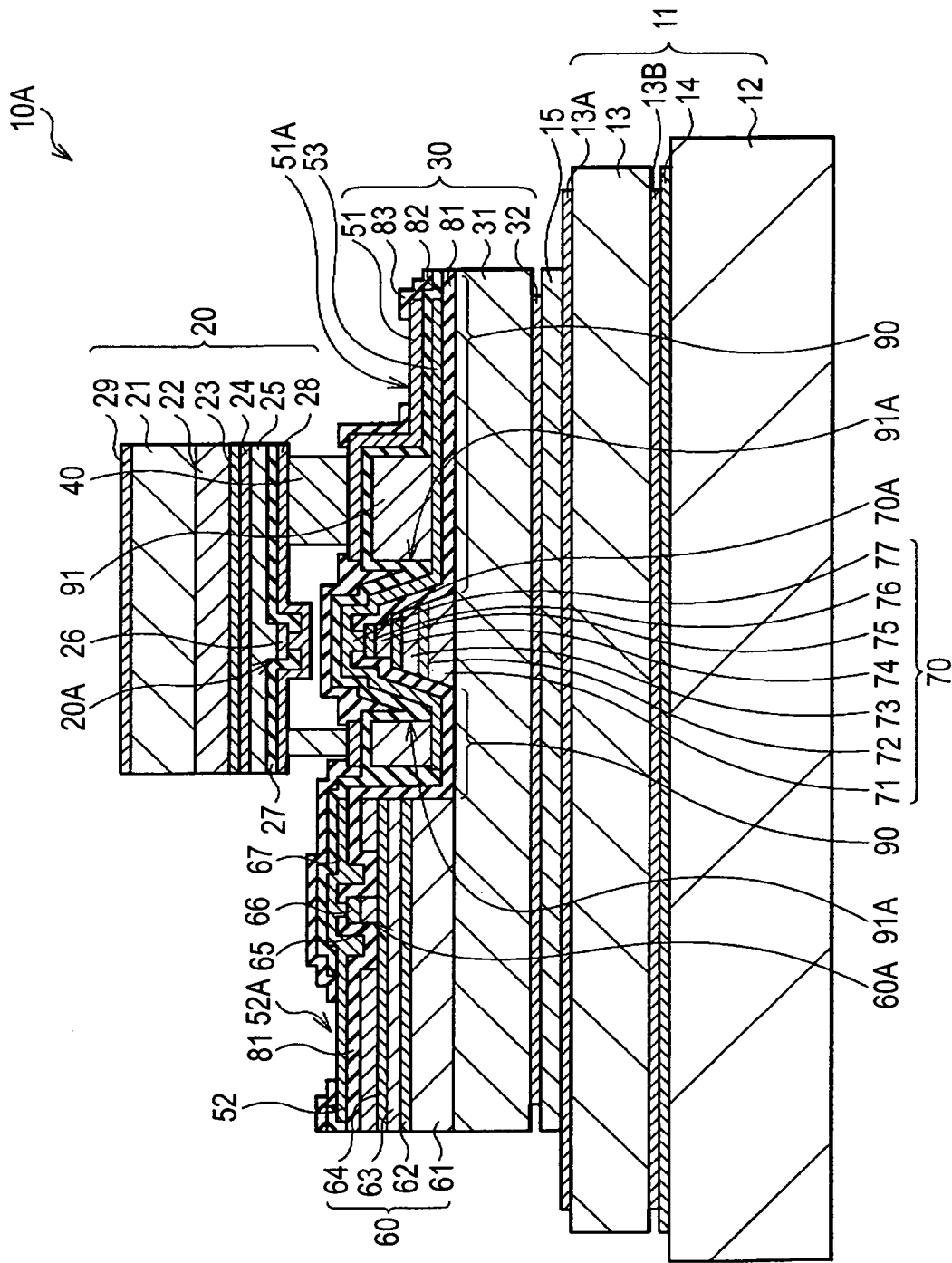
FIG. 1 is a cross-sectional view showing the configuration of a light emitting device according to an embodiment of the present invention.

FIG. 1 is a schematic view showing the cross-sectional structure of a light emitting device 10A according to an embodiment of the present invention. The light emitting device 10A is used in an optical disc recording and reproduction apparatus and the like and is formed by disposing a second light emitting element 30 and a first light emitting element 20 on a support base 11 in this order so as to overlap each other. The first and second light emitting elements 20 and 30 are bonded to each other by a welding layer 40.

The support base 11 has a configuration in which a heat sink 12 and a submount 13 are bonded to each other with a bonding layer 14 interposed therebetween. The second light emitting element 30 is bonded to the submount 13 by a bonding layer 15.

The heat sink 12 has a function as a heat dissipating member which diffuses heat generated in the first and second light emitting elements 20 and 30 and is formed of metal, such as copper (Cu). In addition, the heat sink 12 is electrically connected to an external power source (not shown). Accordingly, the heat sink 12 also serves to electrically connect the second light emitting element 30 to the external power source.

The submount 13 is provided to prevent a chip temperature rise at the time of driving by ensuring heat conduction to the heat sink 12 and accordingly, to realize a long lifespan. For example, the submount 13 is formed of silicon (Si), and may also be formed of AlN in order to further improve the heat dissipation performance.

Conductive bonding layers 13A and 13B for bonding with the bonding layers 14 and 15 are provided on top and bottom surfaces of the submount 13, respectively. It is preferable that the conductive bonding layers 13A and 13B are formed by solder, for example. This is because the heat conductivity can be improved. Specifically, tin (Sn), an alloy of gold (Au) and tin (Sn), an alloy of tin (Sn) and zinc (Zn), or an alloy of silver (Ag) and tin (Sn) may be mentioned. Moreover, it is preferable that the conductive bonding layers 13A and 13B are formed of silver (Ag) paste, for example.

The bonding layers 14 and 15 are preferably formed of a material capable of ensuring a heat dissipation property. For example, it is preferable to form the bonding layers 14 and 15 with silver (Ag) paste or solder. Especially, silver paste is advantageous in that the manufacturing capacity can be increased, and solder is advantageous in that the heat conductivity is improved. For example, silver paste is preferable for an optical disc apparatus for reproduction since the driving current is low and the amount of heat generation is also small.

The first light emitting element 20 is a semiconductor laser which can emit light with a wavelength of around 400 nm, for example. The first light emitting element 20 has a laser oscillating section in which an n-type cladding layer 22, an active layer 23, a deterioration prevention layer 24, a p-type cladding layer 25, and a p-side contact layer 26, which are formed of nitride-based Group III-V compound semiconductor, are laminated in this order from the first substrate 21 side on the side of the first substrate 21, which is formed of nitride-based Group III-V compound semiconductor, facing the support base 11, for example. Here, the nitride-based Group III-V compound semiconductor contains at least one of Group 3B elements in a short period type periodic table and at least nitrogen (N) of Group 5B elements in the short period type periodic table.

Specifically, the first substrate 21 is formed of n-type GaN in which silicon (Si) is added as an n-type impurity, for example. The thickness in the lamination direction (hereinafter, simply referred to as a thickness) is 80 to 100 µm, for example.

The n-type cladding layer 22 has a thickness of 1 µm and is formed of n-type AlGaN (for example, Al0.08Ga0.92N) mixed crystal in which silicon is added as an n-type impurity, for example. The active layer 23 has a thickness of 30 nm and also has a multiple quantum well structure of a well layer and a barrier layer which are formed of $Ga_xIn_{1-x}N$ ($x \geqq 0$) mixed crystal with different compositions, for example. In addition, the active layer 23 functions as a light emitting layer.

The deterioration prevention layer 24 has a thickness of 20 nm and is formed of p-type AlGaN (for example, $Al_{0.2}Ga_{0.8}N$) mixed crystal in which magnesium (Mg) is added as a p-type impurity, for example. The p-type cladding layer 25 has a thickness of 0.7 μm and is formed of p-type AlGaN (for example, $Al_{0.08}Ga_{0.92}N$) mixed crystal in which magnesium is added as a p-type impurity, for example. The p-side contact layer 26 has a thickness of 0.1 μm and is formed of p-type GaN in which magnesium is added as a p-type impurity, for example.

A part of the p-type cladding layer 25 and the p-side contact layer 26 form a narrow strip-shaped ridge section 20A extending in the resonator direction (direction perpendicular to the plane of FIG. 1), and form a so-called laser stripe for current confinement. A region of the active layer 23 corresponding to the p-side contact layer 26 is a light emitting region. The side surface of the p-side contact layer 26 and the bottom surface of the p-type cladding layer 25 are covered with an insulating layer 27 formed of silicon dioxide ($SiO_2$) or the like.

A p-side electrode 28 is formed on the bottom surface of the p-side contact layer 26 and the bottom surface of the insulating layer 27. The p-side electrode 28 is formed by laminating palladium (Pd), platinum (Pt), and gold (Au) sequentially from the p-side contact layer 26 side, for example, and is electrically connected to the p-side contact layer 26. In addition, the p-side electrode 28 is electrically connected to a first wiring layer 51 and a first pad 51A on the second light emitting element 30 with the welding layer 40 interposed therebetween. The welding layer 40 is formed of an alloy of gold (Au) and tin (Sn) or tin, for example.

In addition, an n-side electrode 29 is provided on the top surface of the first substrate 21. The n-side electrode is formed by laminating titanium (Ti) and aluminum sequentially from the first substrate 21 side and alloying them by heat treatment, for example, and is electrically connected to the first substrate 21.

In addition, a pair of side surfaces of the first light emitting element 20 located at the end of the resonator direction are a pair of resonator end surfaces and a pair of reflector films (not shown) are formed on the pair of resonator end surfaces, respectively. One of the pair of reflector films is set to reflect light generated in the active layer 23 with high reflectance and the other one is set to reflect the light with lower reflectance than that, such that light is emitted from the other side.

Figure 2:
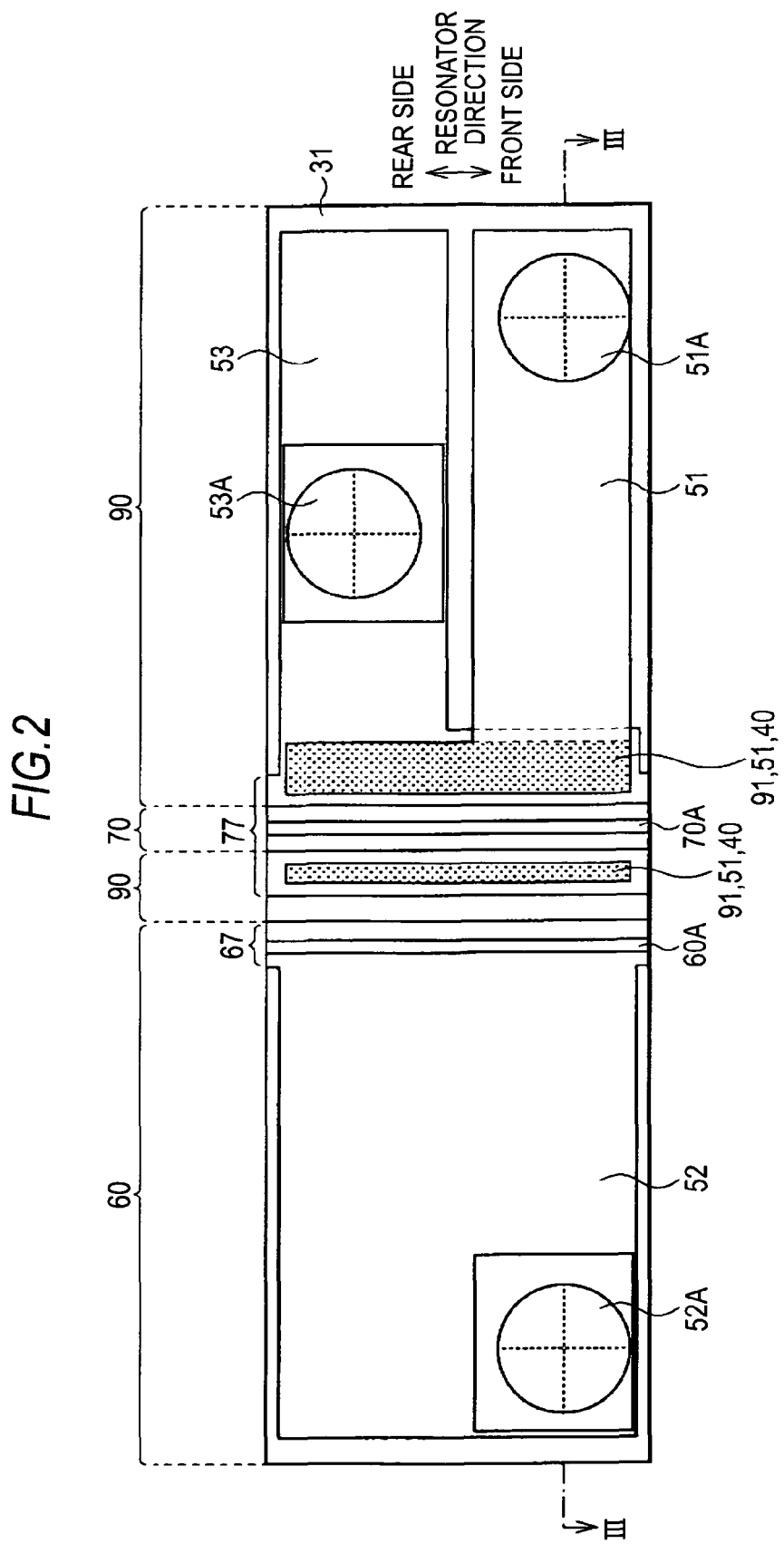
FIG. 2 is a plan view showing the configuration of a second light emitting element shown in FIG. 1.
Figure 3:
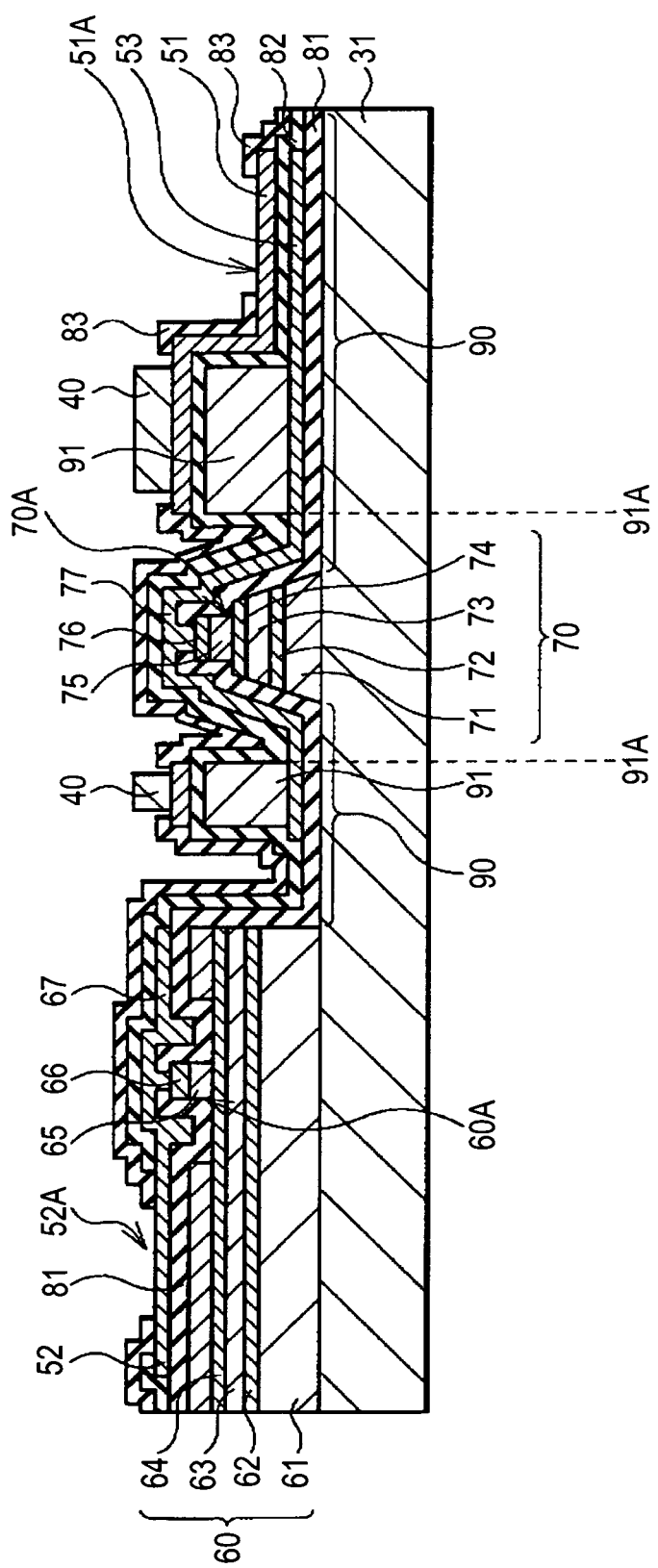
FIG. 3 is a cross-sectional view taken along the line in FIG. 2.

FIGS. 2 and 3 show the planar configuration and cross-sectional configuration of the second light emitting element 30, respectively. The second light emitting element 30 has a second substrate 31, for example. A laser oscillating section 60, which can emit light with a 700 nm-band wavelength (for example, 780 nm), and a laser oscillating section 70, which can emit light with a 600 nm-band wavelength (for example, 650 nm), are provided at the side of the second substrate 31 facing the first light emitting element 20. The second substrate 31 has a thickness of about 100 μm and is formed of n-type GaAs in which silicon is added as an n-type impurity, for example. The laser oscillating sections 60 and 70 are disposed with a gap of about 200 μm therebetween such that the resonator direction is aligned with the first light emitting element 20 and the p-side contact layer 26 of the first light emitting element 20 is located above the laser oscillating section 70 (for example, right above the laser oscillating section 70 in FIG. 1). Specifically, a distance between a light emitting region of the laser oscillating section 60, which will be described later, and a light emitting region of the laser oscillating section 70, which will be described later, is about 120 μm micrometers. The light emitting region of the first light emitting element 20 is located exactly right above the laser oscillating section of the laser oscillating section 70, which will be described later.

The laser oscillating section 60 has a configuration in which an n-type cladding layer 61, an active layer 62, a p-type lower cladding layer 63, an etching stop layer 64, a p-type upper cladding layer 65, and a p-side contact layer 66, which are formed of Group III-V compound semiconductor containing at least gallium (Ga) of Group 3B elements in the short period type periodic table and at least arsenic (As) of Group 5B elements in the short period type periodic table, are laminated in this order from the second substrate 31 side, for example.

Specifically, the n-type cladding layer 61 has a thickness of about 1.5 μm and is formed of n-type AlGaAs mixed crystal in which silicon is added as an n-type impurity, for example. The active layer 62 has a thickness of 40 nm and also has a multiple quantum well structure of a well layer and a barrier layer which are formed of $Al_xGa_{1-x}As$ ($x \geqq 0$) mixed crystal with different compositions, for example. In addition, the active layer 62 functions as a light emitting layer, and the wavelength of emitted light is a 700 nm-band wavelength, for example. The total thickness of the p-type lower cladding layer 63 and the p-type upper cladding layer 65 is 1.5 μm and the p-type lower cladding layer 63 and the p-type upper cladding layer 65 are formed of p-type AlGaAs mixed crystal in which zinc is added as a p-type impurity, for example. The etching stop layer 64 has a thickness of about 30 nm and is formed of p-type AlGaAs mixed crystal, for example. The p-side contact layer 66 has a thickness of about 0.5 μm and is formed of p-type GaAs in which zinc is added as a p-type impurity, for example.

The p-type upper cladding layer 65 and the p-side contact layer 66 form a narrow strip-shaped ridge section 60A, which extends in the resonator direction, for current confinement. A region of the active layer 62 corresponding to the p-side contact layer 66 is a light emitting region. An insulating layer 81 is provided on the side surface of the p-side contact layer 66, the side surface of the p-type upper cladding layer 65, and the top surface of the etching stop layer 64. The insulating layer 81 covers the side surfaces of the etching stop layer 64 to the n-type cladding layer 61 and also covers the laser oscillating section 70 and the top surface of the second substrate 31 excluding a region corresponding to the laser oscillating section 70. The insulating layer 81 has a thickness of about 100 nm and is formed of silicon oxide ($SiO_2$) for example.

A p-side electrode 67 is formed on the p-side contact layer 66. The p-side electrode 67 is formed by laminating a titanium layer with a thickness of 50 nm, a platinum layer with a thickness of 100 nm, and a gold layer with a thickness of 300 nm sequentially from the p-side contact layer 66 side and alloying them by heat treatment, for example, and is electrically connected to the p-side contact layer 66. A second wiring layer 52 and a second pad 52A are continuously provided on the p-side electrode 67.

The laser oscillating section 70 has a configuration in which an n-type cladding layer 71, an active layer 72, a p-type lower cladding layer 73, an etching stop layer 74, a p-type upper cladding layer 75, and a p-side contact layer 76 are laminated in this order from the second substrate 31 side, for example. Each of the layers is formed of Group III-V compound semiconductor containing at least indium (In) of Group 3B elements in the short period type periodic table and at least phosphorus (P) of Group 5B elements in the short period type periodic table, for example.

Specifically, the n-type cladding layer 71 has a thickness of about 1.5 μm and is formed of n-type AlGaInP mixed crystal in which silicon is added as an n-type impurity, for example. The active layer 72 has a thickness of 35 nm and also has a multiple quantum well structure of a well layer and a barrier layer which are formed of AlxGayIn1-x-yP (x≧0 and y≧0) mixed crystal with different compositions, for example. In addition, the active layer 72 functions as a light emitting layer. The total thickness of the p-type lower cladding layer 73 and the p-type upper cladding layer 75 is 1.0 μm and the p-type lower cladding layer 73 and the p-type upper cladding layer 75 are formed of p-type AlGaInP mixed crystal in which zinc is added as a p-type impurity, for example. The etching stop layer 74 has a thickness of about 20 nm and is formed of p-type GaInP mixed crystal, for example. The p-side contact layer 76 has a thickness of about 0.5 μm and is formed of p-type GaAs in which zinc is added as a p-type impurity, for example.

The p-type upper cladding layer 75 and the p-side contact layer 76 form a narrow strip-shaped ridge section 70A, which extends in the resonator direction, for current confinement. A region of the active layer 72 corresponding to the p-side contact layer 76 is a light emitting region. The same insulating layer 81 as for the laser oscillating section 60 is provided on the side surfaces of the p-side contact layer 76 to the n-type cladding layer 71.

A p-side electrode 77 which is electrically connected to the p-side contact layer 76 and has the same configuration as the p-side electrode 67, for example, is provided on the p-side contact layer 76. In addition, the p-side electrode 77 is provided continuously to a third wiring layer 53 and a third pad 53A (not shown in FIGS. 1 and 3; refer to FIG. 2).

In addition, an n-side electrode 32 of the laser oscillating sections 60 and 70 is formed on the bottom surface of the second substrate 31 (facing the support base 11). The n-side electrode 32 is formed by laminating an alloy of gold and germanium (Ge), nickel, and gold sequentially from the second substrate 31 side and alloying them by heat treatment, for example.

In addition, a pair of side surfaces of the second light emitting element 30 located at the end of the resonator direction are a pair of resonator end surfaces, and a pair of reflector films (not shown) are formed on the pair of resonator end surfaces, respectively, in each of the laser oscillating sections 60 and 70. In each of the pair of reflector films, the reflectance is set to correspond to that of each of a pair of reflector films (not shown) provided in the first light emitting element 20. Accordingly, the laser oscillating sections 60 and 70 of the first and second light emitting elements 20 and 30 can emit light from the same side.

The n-type cladding layer 71 to the etching stop layer 74 of the laser oscillating section 70 are provided near the ridge section 70A, that is, only in a region contributing to emission and are not provided in a peripheral section 90 excluding the laser oscillating sections 60 and 70. An embedded layer 91 (heat dissipating layer) formed of a material with higher heat conductivity than the n-type cladding layer 71 to the etching stop layer 74, for example, gold (Au) is provided in the peripheral section 90. This can improve the heat dissipation property in the light emitting device 10A.

When the embedded layer 91 is formed of gold (Au), the embedded layer 91 is provided on the p-side electrode 77 and the third wiring layer 53, for example. The thickness of the embedded layer 91 is preferably set to about 1 μm to 3 μm, for example, similar to the total thickness of the n-type cladding layer 71 to the etching stop layer 74.

In addition to having higher heat conductivity than the n-type cladding layer 71 to the etching stop layer 74, it is preferable that the embedded layer 91 has a coefficient of thermal expansion (coefficient of linear expansion) close to those of the n-type cladding layer 71 to the etching stop layer 74 and low Young's-modulus. This can reduce an influence of the stress on the n-type cladding layer 71 to the etching stop layer 74 of the laser oscillating section 70.

In addition, the embedded layer 91 also has a function as a support base of the first light emitting element 20 together with the welding layer 40. Accordingly, it is preferable that the width (size in a direction perpendicular to the resonator direction) and the length (size in the resonator direction) of the embedded layer 91 are appropriately set according to the size of the first light emitting element 20. In addition, the heat dissipation property is improved in proportion to an increase in the size of the embedded layer 91.

On the embedded layer 91, the first wiring layer 51 and the welding layer 40 are provided with an insulating layer 82 interposed therebetween. The insulating layer 82 has a thickness of about 300 nm and is formed of silicon nitride (SiN), for example. The first wiring layer 51 is formed by laminating a titanium layer with a thickness of 50 nm, a platinum layer with a thickness of 100 nm, and a gold layer with a thickness of 100 nm sequentially from the embedded layer 91 side and alloying them by heat treatment, for example, and is electrically connected to the welding layer 40. The first pad 51A is provided in the first wiring layer 51.

For example, the welding layer 40 is provided between the embedded layer 91 and the first light emitting element 20 around the ridge section 20A of the first light emitting element 20. However, the welding layer 40 may be provided on the entire surface including the ridge section 20A of the first light emitting element 20. The first wiring layer 51 is covered with an insulating layer 83 except for a portion where the first pad 51A and the welding layer 40 are provided. The insulating layer 83 has a thickness of about 100 nm and is formed of silicon nitride (SiN), for example.

An end 91A of the embedded layer 91 facing the ridge section 70A is preferably located in a range equal to or larger than 2 μm and smaller than 30 μm from an end 70B (refer to FIG. 5) of the ridge section 70A. If the distance is smaller than 2 μm, optical distribution of laser light, radiation shape (FFP), optical absorption loss, and the like may be adversely affected. Moreover, if the distance is larger than 30 μm, an effect of improving the heat dissipation property is not sufficiently acquired because the embedded layer 91 is too far from the laser oscillating section 70.

Figure 4:
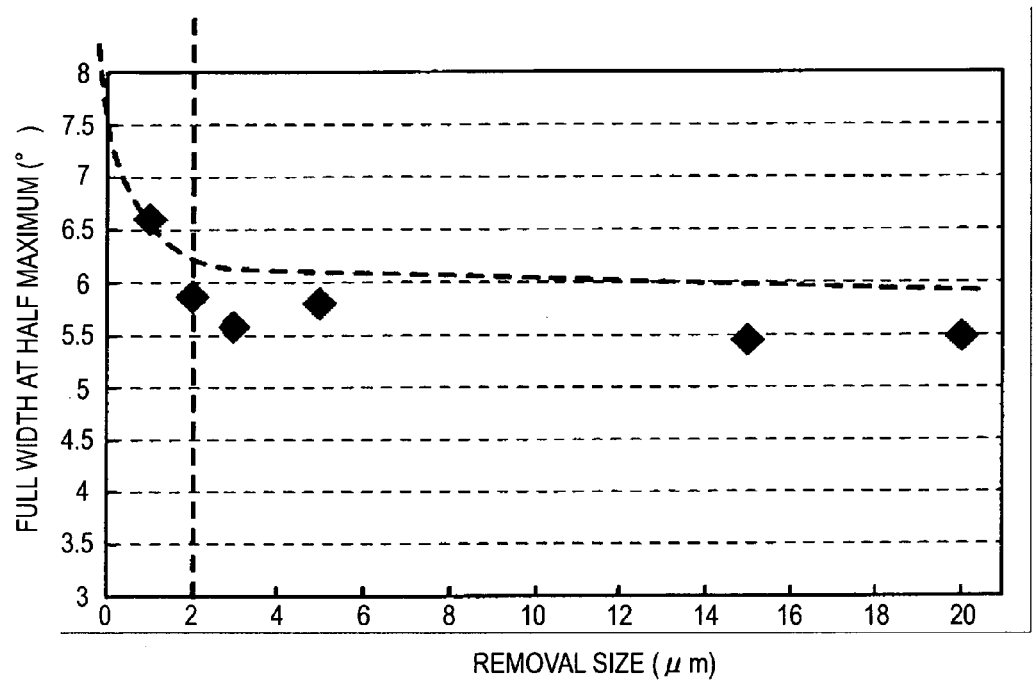
FIG. 4 is a cross-sectional view showing a light emitting section of the second light emitting element shown in FIG. 2 in an enlarged manner.
Figure 5:
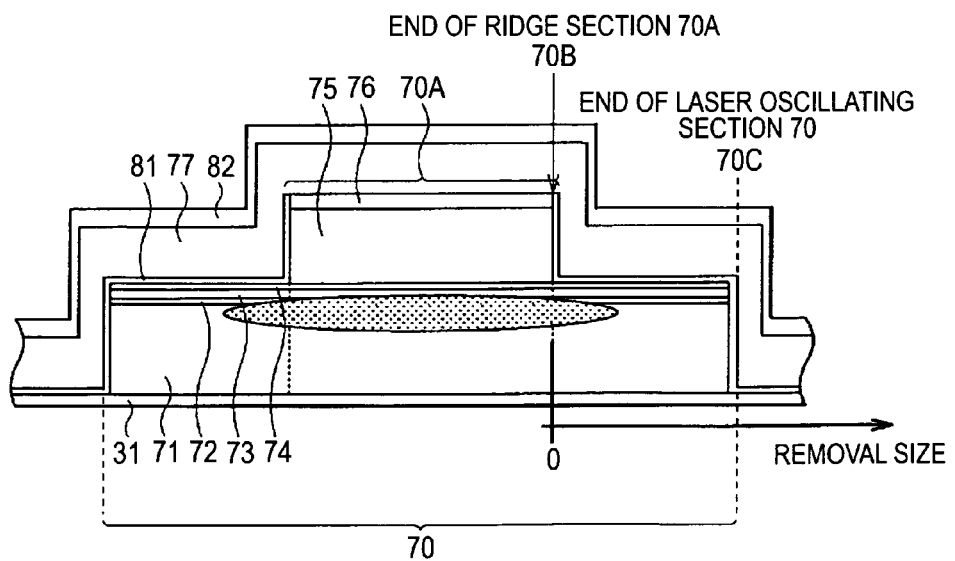
FIG. 5 is a view showing the dependence of an FFP on the position of an end of an embedded layer.

FIG. 4 shows a simulation result regarding the dependence of the FFP of the laser oscillating section 70 on the removal size of the n-type cladding layer 71 to the etching stop layer 74. Here, as shown in FIG. 5, the removal size is a distance between the end 70B of the ridge section 70A and the end 70C of the laser oscillating section 70 (removal position of the n-type cladding layer 71 to the etching stop layer 74, that is, the position of the end 91A of the embedded layer 91). As can be seen from FIG. 4, if the removal size is smaller than 2 μm, a full width at half maximum (FWHM), that is, a beam spread angle is increased. That is, if the removal size of the n-type cladding layer 71 to the etching stop layer 74 is 2 μm or more, it can be seen that an influence on the FFP can be suppressed.

In addition, it is preferable that the embedded layer 91 is provided in a range of 30 μm or less from the end 70B of the ridge section 70A. This is because an effect of improving the heat dissipation property is not sufficiently acquired because the embedded layer 91 is too far from the ridge section 70A or the laser oscillating section 70.

For example, the light emitting device 10A can be manufactured as follows.

FIGS. 6A to 13B show a method of manufacturing the light emitting device 10A in process order. In addition, the method of manufacturing the first light emitting element 20 will be described with reference to FIG. 1.

First, the first light emitting element 20 shown in FIG. 1 is formed. That is, for example, the first substrate 21 formed of n-type GaN with a thickness of about 400 µm is prepared. Then, the n-type cladding layer 22 formed of n-type AlGaN mixed crystal, the active layer 23 formed of InGaN mixed crystal, the deterioration prevention layer 24 formed of p-type AlGaN mixed crystal, the p-type cladding layer 25 formed of p-type AlGaN mixed crystal, and the p-side contact layer 26 formed of p-type GaN are sequentially grown on the surface of the first substrate 21 using the MOCVD method. In addition, when these layers are grown, the temperature of the first substrate 21 is adjusted to 750° C. to 1100° C., for example.

Then, a mask (not shown) is formed on the p-side contact layer 26 and upper portions of the p-side contact layer 26 and the p-type cladding layer 25 are selectively etched. As a result, the narrow strip-shaped ridge section 20A is formed to expose the p-type cladding layer 25 on the surface. Then, using the mask (not shown) on the p-side contact layer 26, the insulating layer 27 is formed to cover the surface of the p-type cladding layer 25 and the side surface of the p-side contact layer 26.

After forming the insulating layer 27, the p-side electrode 28 is formed by depositing palladium, platinum, and gold sequentially on the surface of the p-side contact layer 26 and its neighborhood. Moreover, in order to easily perform cleavage of the first substrate 21 in the process to be described later, the thickness of the first substrate 21 is adjusted to about 100 µm by lapping and polishing the back surface side of the first substrate 21, for example.

Then, the n-side electrode 29 is formed, for example, by depositing titanium and aluminum sequentially on the back surface side of the first substrate 21. After forming the n-side electrode 29, heat treatment is performed to alloy the n-side electrode 29. Thereafter, although not shown herein, cleavage of the first substrate 21 is performed, for example, in a predetermined width and in a direction perpendicular to the longitudinal direction of the p-side electrode 28, and a pair of reflector films are formed on the cleavage surface. In this way, the first light emitting element 20 shown in FIG. 1 is manufactured.

On the other hand, for example, the second substrate 31 formed of n-type GaAs with a thickness of about 350 µm is prepared. Then, the n-type cladding layer 61 formed of n-type AlGaAs mixed crystal, the active layer 62 formed of AlxGa1-xAs ($x \geq 0$) mixed crystal, the p-type lower cladding layer 63 formed of p-type AlGaAs mixed crystal, the etching stop layer 64 formed of p-type AlGaAs mixed crystal, the p-type upper cladding layer 65 formed of p-type AlGaAs mixed crystal, and the p-side contact layer 66 formed of p-type GaAs are sequentially grown on the surface of the second substrate 31 using the MOCVD method. In addition, when these layers are grown, the temperature of the second substrate 31 is adjusted to 750° C. to 800° C., for example.

Then, a resist film (not shown) is formed on a p-type cap layer 44 so as to correspond to a region where the laser oscillating section 60 is to be formed. Then, using the resist film (not shown) as a mask, the p-side contact layer 66 is selectively removed using sulfuric acid-based etchant and portions of the p-side contact layer 66, the p-type upper cladding layer 65, the etching stop layer 64, the p-type lower cladding layer 63, the active layer 62, and the n-type cladding layer 61, which are not covered with the resist film (not shown), are selectively removed using hydrofluoric acid-based etchant, for example. Then, the resist film (not shown) is removed.

Then, the n-type cladding layer 71 formed of n-type AlGaInP mixed crystal, the active layer 72 formed of Al$_x$Ga$_y$In1-x-yP ($x \geq 0$ and $y \geq 0$) mixed crystal, the p-type lower cladding layer 73 formed of p-type AlGaInP mixed crystal, the etching stop layer 74 formed of p-type GaInP mixed crystal, the p-type upper cladding layer 75 formed of p-type AlGaInP mixed crystal, and the p-side contact layer 76 formed of p-type GaAs are grown sequentially using the MOCVD method, for example. In addition, when these layers are grown, the temperature of the second substrate 31 is adjusted to about 680° C., for example.

Then, a resist film (not shown) is formed on the p-side contact layer 76 so as to correspond to a region where the laser oscillating section 70 is to be formed. Then, using the resist film (not shown) as a mask, the p-side contact layer 76 is selectively removed using sulfuric acid-based etchant and the p-type upper cladding layer 75, the etching stop layer 74, the p-type lower cladding layer 73, the active layer 72, and the n-type cladding layer 71 are selectively removed using phosphoric acid-based and hydrofluoric acid-based etchant, for example. Then, the resist film (not shown) is removed.

After removing the resist film (not shown), as shown in FIG. 6A, the ridge sections 60A and 70A are formed by forming a narrow strip-shaped mask (not shown) on the p-side contact layers 76 and 66 and selectively removing the p-side contact layers 66 and 76 and the p-type upper cladding layers 65 and 75 until reaching the etching stop layers 64 and 74. The distance between the ridge sections 60A and 70A is set to about 110 µm, for example.

After forming the ridge sections 60A and 70A, an insulating layer (not shown) is formed on the entire surface of the second substrate 31, and this insulating layer (not shown) is selectively removed by photolithography and etching. As a result, as shown in FIG. 6B, masks M60 and M70 are formed on the top and side surfaces of the ridge sections 60A and 70A, respectively. For example, the masks M60 and M70 are preferably formed by an insulating layer, such as silicon nitride (SiN).

After forming the masks M60 and M70, as shown in FIG. 7A, the p-side contact layers 66 and 76 excluding the ridge sections 60A and 70A are selectively removed by wet etching using ammonia and oxygenated water as etchant, for example. As a result, since the p-side contact layers 66 and 76 remain only in the ridge sections 60A and 70A, leakage of a current through the p-side contact layers 66 and 76 is suppressed. As a mixing ratio of ammonia and oxygenated water, for example, ammonia:oxygenated water=1:30 is set at 4° C.

Then, as shown in FIG. 7B, the laser oscillating section 70 is formed by selectively removing regions of the n-type cladding layer 71 to the etching stop layer 74, which are not covered with the mask M70, by wet etching using hydrochloric acid and water as etchant, for example. At this time, the laser oscillating section 60 including the n-type cladding layer 61 to the p-side contact layer 66 is not removed. As a result, the peripheral section 90 from which the n-type cladding layer 71 to the etching stop layer 74 have been removed is formed in a region excluding the laser oscillating sections 60 and 70.

Thus, the mask M70 is also used as a mask for forming the peripheral section 90 by removing the n-type cladding layer 71 to the etching stop layer 74 excluding the vicinity of the ridge section 70A. Therefore, it is preferable that the width W70 of the mask M70 is appropriately set in consideration of the finished width of the laser oscillating section 70.

After forming the peripheral section 90, as shown in FIG. 8A, the masks M60 and M70 are removed.

After removing the masks M60 and M70, as shown in FIG. 8B, the insulating layer 81 formed of $SiO_2$ or the like is formed in a thickness of 100 nm, for example, on the entire surface of the second substrate 31. Then, as shown in FIG. 9A, openings are formed in the insulating layer 81 located on the ridge sections 60A and 70A by selectively removing the insulating layer 81 by photolithography and etching, for example.

After forming the openings in the insulating layer 81, as shown in FIG. 9B, a mask R1 formed of photoresist is formed on the insulating layer 81 by photolithography, for example. This mask R1 is used to form the p-side electrodes 67 and 77, and is formed on the side surfaces of the n-type cladding layer 61 to the p-type upper cladding layer 65 and the neighborhood as a boundary between the laser oscillating sections 60 and 70.

Figure 10A:
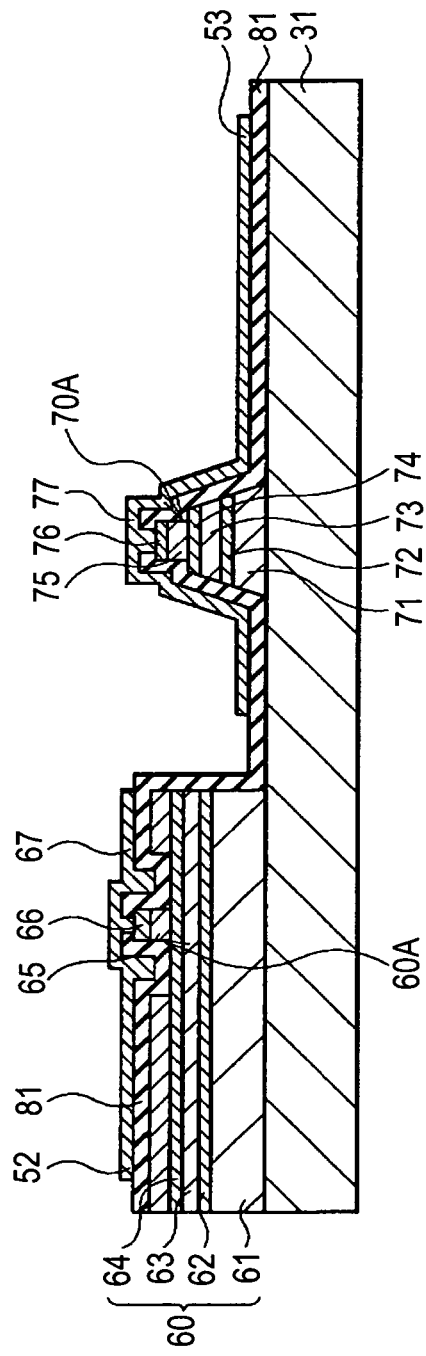
FIGS. 10A and 10B are cross-sectional views for explaining the manufacturing process subsequent to FIGS. 9A and 9B.

After forming the mask R1, a titanium layer with a thickness of 50 nm, a platinum layer with a thickness of 100 nm, and a gold layer with a thickness of 300 nm are laminated on the entire surface of the second substrate 31 sequentially from the side of the p-side contact layers 66 and 76 using a vapor deposition method, for example. Then, as shown in FIG. 10A, by the lift-off method using the mask R1, the p-side electrodes 67 and 77 are formed on the laser oscillating sections 60 and 70, respectively, and the second wiring layer 52 is provided continuously to the p-side electrode 67 and the third wiring layer 53 is provided continuously to the p-side electrode 77.

Figure 10B:
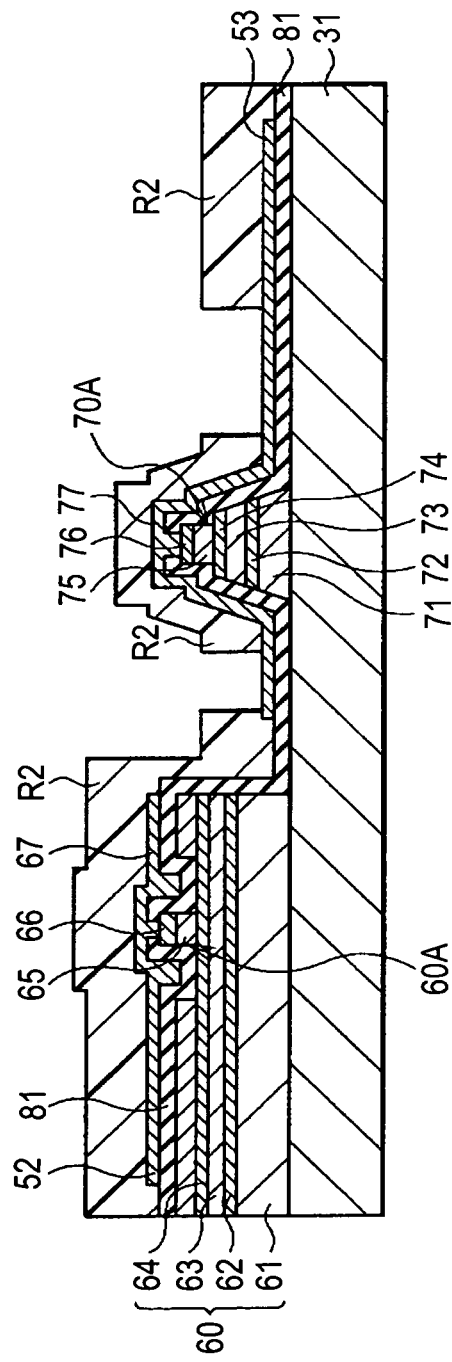

After forming the p-side electrodes 67 and 77 and the like, as shown in FIG. 10B, a mask R2 which is formed of photoresist and is used to form the embedded layer 91 is formed on the laser oscillating sections 60 and 70 and the third wiring layer 53 by photolithography, for example.

After forming the mask R2, a gold (Au) layer is formed on the entire surface of the second substrate 31 in a thickness of 3 μm by an electroplating, vapor deposition, or sputtering method, for example. Then, as shown in FIG. 11A, the embedded layer 91 is formed in the peripheral section 90 by the lift-off method using the mask R2. In addition, the stress of the embedded layer 91 may be adjusted according to the method of forming a gold layer. In particular, the stress can be reduced if the electroplating method is used.

After forming the embedded layer 91, as shown in FIG. 11B, the insulating layer 82 formed of SiN or the like is formed in a thickness, of 300 nm, for example, on the entire surface of the second substrate 31. It is preferable that the insulating layer 82 is formed by the sputtering method, for example. This is because a step difference of the side surface of the embedded layer 91 can be reliably covered by the insulating layer 82 and accordingly, a possibility that the first wiring layer 51 may cut off on the side surface of the embedded layer 91 is reduced.

After forming the insulating layer 82, as shown in FIG. 12A, a mask R3 formed of photoresist is formed on the insulating layer 82 by photolithography, for example. This mask R3 is used to form the first wiring layer 51, and is formed on the surfaces of the laser oscillating sections 60 and 70.

After forming the mask R3, a titanium layer with a thickness of 50 nm, a platinum layer with a thickness of 100 nm, and a gold layer with a thickness of 100 nm are laminated on the entire surface of the second substrate 31 sequentially from the embedded layer 91 side using a vapor deposition method, for example. Then, as shown in FIG. 12B, the first wiring layer 51 is formed on the embedded layer 91 and its neighborhood by the lift-off method using the mask R3.

After forming the first wiring layer 51, the insulating layer 83 which has the above-described thickness and is formed of the above-described material is formed on the entire surface of the second substrate 31. Then, as shown in FIG. 13A, an opening is formed on the embedded layer 91 and the first pad 51A is formed in the first wiring layer 51 by selectively removing the insulating layer 83 by photolithography and etching, for example. In addition, the second pads 52A and 52B are formed in the second wiring layer 52 and the third pad 53A is formed in the third wiring layer 53 by selectively removing the insulating layer 82.

After forming the opening in the insulating layer 83, as shown in FIG. 13B, the welding layer 40 formed of the above-described material is formed in the opening of the insulating layer 83.

In addition, the thickness of the second substrate 31 is adjusted to about 100 μm by lapping and polishing the back surface side of the second substrate 31, for example. Then, the n-side electrode 32 common to the laser oscillating sections 60 and 70 is formed by depositing an alloy of gold and germanium, nickel, and gold sequentially on the back surface side of the second substrate 31, for example. Then, heat treatment is performed to alloy each of the p-side electrodes 67 and 77 and the n-side electrode 32. In addition, although not shown herein, cleavage of the second substrate 31 is performed, for example, in a predetermined width and in a direction perpendicular to the longitudinal direction of the p-side electrodes 67 and 77, and a pair of reflector films are formed on the cleavage surface. In this way, the second light emitting element 30 is manufactured.

After manufacturing the first and second light emitting elements 20 and 30, the bonding layer 14 is formed on the top surface of the heat sink 12 and the conductive bonding layers 13A and 13B are formed on the top and bottom surfaces of the submount 13, respectively. Then, the heat sink 12 and the submount 13 are bonded to each other using the bonding layer 14 and the conductive bonding layer 13B. As a result, the support base 11 is formed.

After forming the support base 11, the n-side electrode 32 of the second light emitting element 30 and the support base 11 are bonded to each other by the bonding layer 15 and the conductive bonding layer 13A, for example. In addition, the first wiring layer 51 and the p-side electrode 28 of the first light emitting element 20 are bonded to each other by the welding layer 40, for example. As a result, the light emitting device 10A shown in FIG. 1 is completed.

In this light emitting device 10A, when a voltage is applied between the n-side electrode 29 and the p-side electrode 28 of the first light emitting element 20, a current flows through the active layer 23. This causes light emission by electron-hole recombination, and light with a wavelength of around 400 nm is emitted from the first light emitting element 20. In addition, when a predetermined voltage is applied between the p-side electrode 67 and the n-side electrode 32 of the second light emitting element 30, a current flows through the active layer 62. This causes light emission by electron-hole recombination, and light with a 700 nm-band wavelength is emitted from the laser oscillating section 60. In addition, when a predetermined voltage is applied between the p-side electrode 77 and the n-side electrode 32 of the second light emitting element 30, a current flows through the active layer 72.

This causes light emission by electron-hole recombination, and light with a 600 nm-band wavelength is emitted from the laser oscillating section 70.

Figure 14:
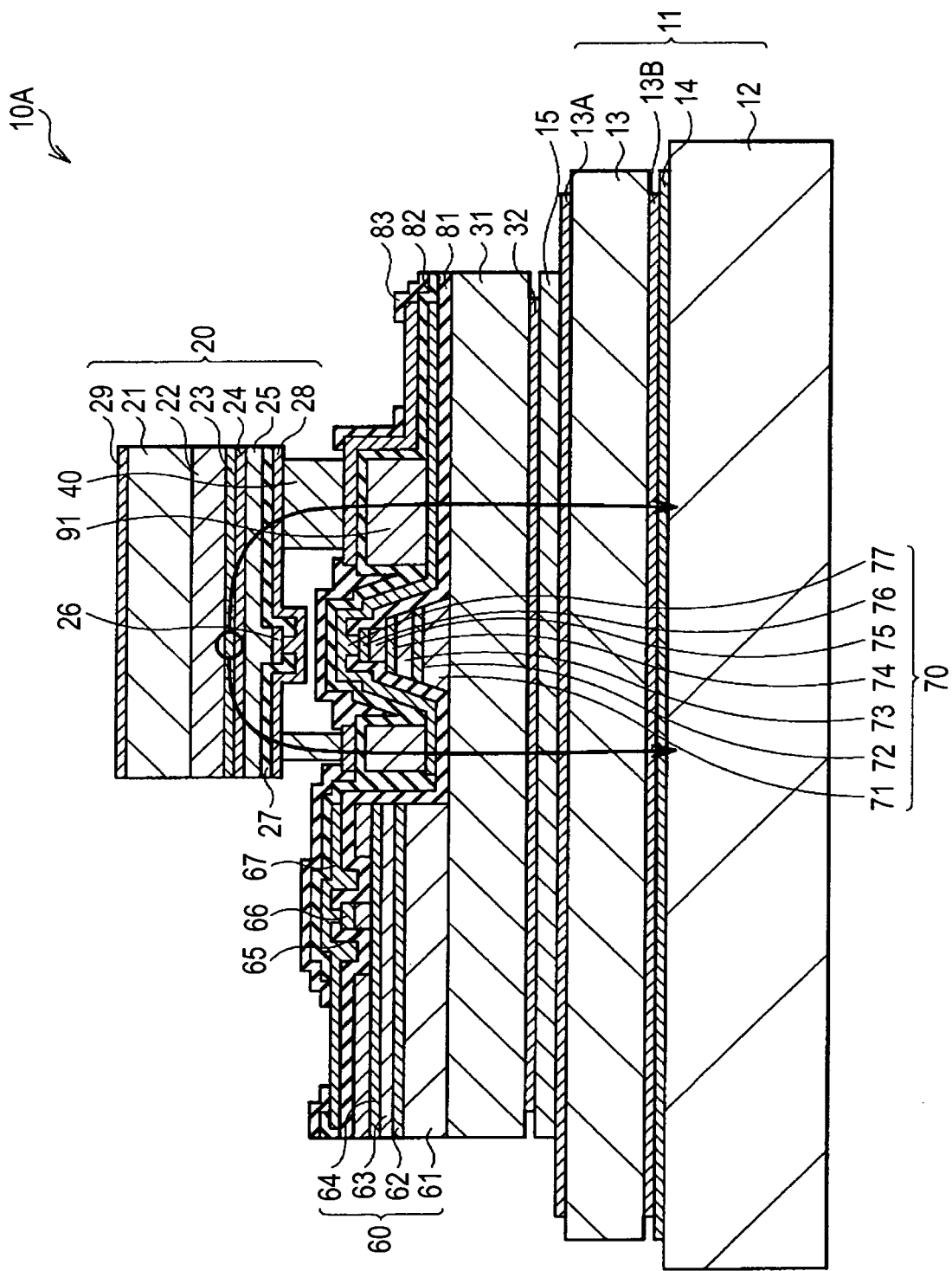
FIG. 14 is a cross-sectional view for explaining an operation of the light emitting device shown in FIG. 1.

In addition, although heat is generated when light is emitted, heat generated in the first light emitting element 20 is transmitted to the support base 11 through the embedded layer 91 with high heat conductivity as shown in FIG. 14 since the n-type cladding layer 71 to the etching stop layer 74 of the peripheral section 90 of the second substrate 31 excluding the laser oscillating sections 60 and 70 are removed and the embedded layer 91, which is formed of a material with higher heat conductivity than the n-type cladding layer 71 to the etching stop layer 74, is provided in the peripheral section 90. Therefore, the heat dissipation property is improved. On the other hand, heat generated in the laser oscillating section 60 or 70 is diffused through the support base 11.

Figure 15:
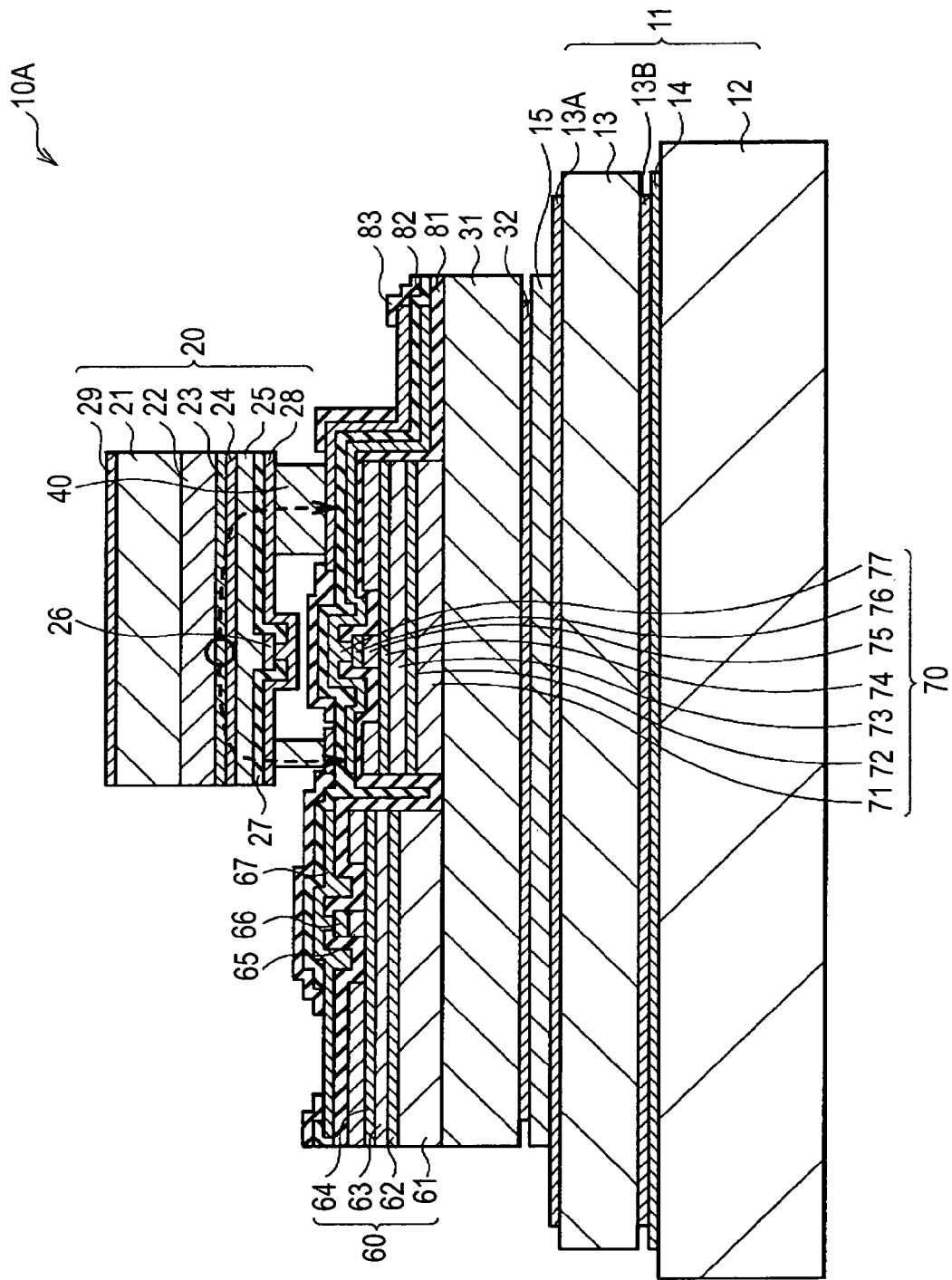
FIG. 15 is a cross-sectional view for explaining an operation of a known light emitting device.

On the other hand, if the embedded layer 91 is not provided, a dissipation path of heat generated in the first light emitting element 20 is blocked due to the n-type cladding layer 71 to the etching stop layer 74 formed of AlGaAs-based compound semiconductor with low heat conductivity, as shown in FIG. 15. As a result, the heat dissipation property is degraded.

Thus, in the present embodiment, since the embedded layer 91 formed of a material with higher heat conductivity than the n-type cladding layer 71 to the etching stop layer 74 is provided in the peripheral section 90 of the second substrate 31 excluding the laser oscillating sections 60 and 70, it is possible to improve the heat dissipation property. As a result, it is possible to improve the reliability of the light emitting device 10A against a high temperature and the long-term reliability of the light emitting device 10A. In addition, the second light emitting element 30 having the second substrate 31, which is formed of GaAs with low heat conductivity, can be used as a chip for which a larger area is necessary. This is very advantageous in cost reduction of a multi-wavelength laser.

(Applications)

Figure 16:
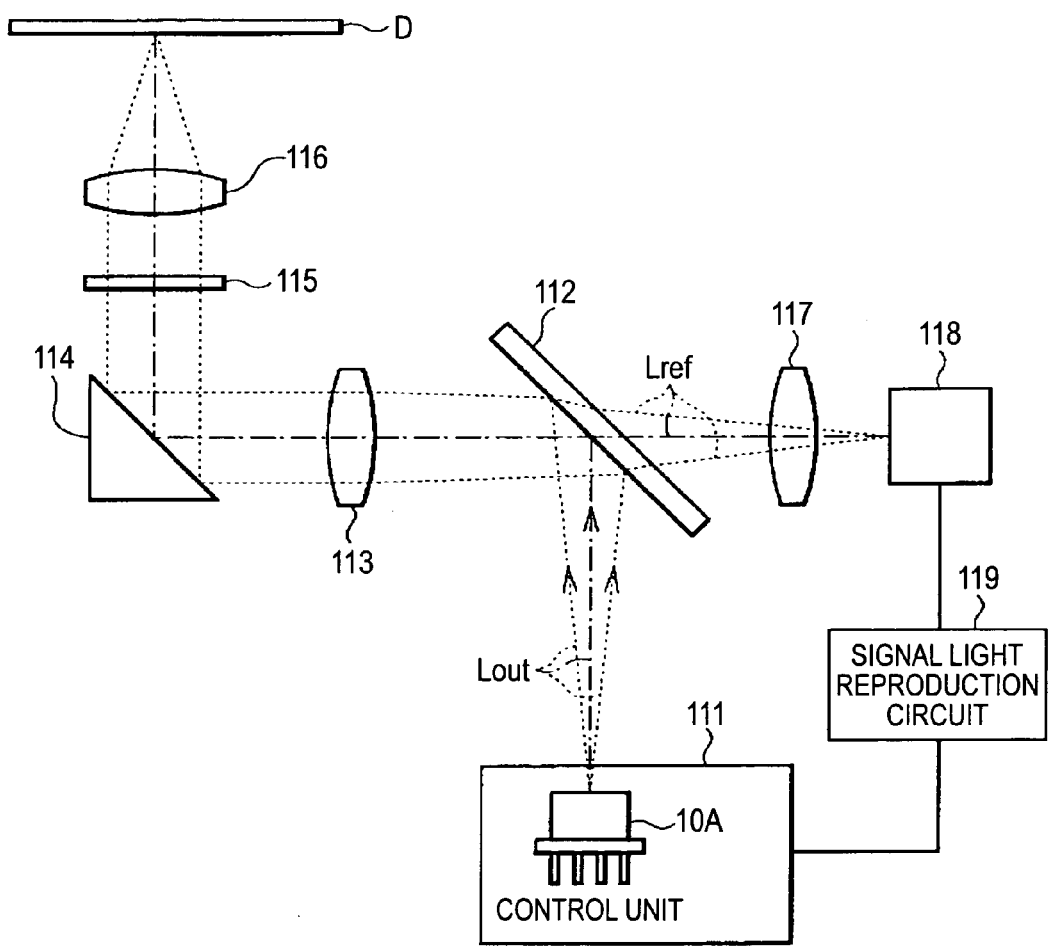
FIG. 16 is a view showing the configuration of an optical disc recording and reproduction apparatus using the light emitting device shown in FIG. 1.

The light emitting device 10A is used in an optical disc recording and reproduction apparatus as an optical apparatus, for example. FIG. 16 is a schematic view showing the configuration of the optical disc recording and reproduction apparatus. This optical disc recording and reproduction apparatus is for reproducing the information recorded on an optical disc using light beams with different wavelengths and for recording the information on the optical disc. This optical disc recording and reproduction apparatus includes the light emitting device 10A according to the present embodiment and an optical system which guides outgoing light Lout with a predetermined emission wavelength emitted from the light emitting device 10A to an optical disc D on the basis of control of a control unit 111 and which reads signal light (reflected light Lref) from the optical disc D, that is, a beam splitter 112, a collimator lens 113, a mirror 114, an opening limiting aperture 115, an objective lens 116, a lens for signal light detection 117, a light receiving element for signal light detection 118, and a signal light reproduction circuit 119.

In this optical disc recording and reproduction apparatus, for example, the outgoing light Lout with high intensity emitted from the light emitting device 10 is reflected by the beam splitter 112, becomes parallel light by the collimator lens 113, and is reflected by the mirror 114. The outgoing light Lout reflected by the mirror 134 passes through the opening limiting aperture 115 and is then condensed by the objective lens 116 and incident on the optical disc D. As a result, information is written on the optical disc D. Moreover, for example, the weak outgoing light Lout emitted from the light emitting device 10 is incident on the optical disc D through each optical system as described above and is then reflected by the optical disc D. This reflected light Lref passes the lens for signal light detection 117 through the objective lens 116, the opening limiting aperture 115, the mirror 114, the collimator lens 113, and the beam splitter 112 and is then incident on the light receiving element for signal light detection 118. Here, the reflected light Lref is converted into an electric signal and then the information written on the optical disc D is reproduced in the signal light reproduction circuit 119.

In addition, the light emitting device 10A according to the present embodiment can be housed in one package and can emit the outgoing light Lout from a plurality of light emitting regions, a distance between which is precisely specified. Accordingly, if the light emitting device 10A is used, a plurality of outgoing light beams Lout with different wavelengths can be guided to a predetermined place using a common optical system. As a result, simplification, miniaturization, and cost reduction of the optical disc recording and reproduction apparatus can be realized. Moreover, since an error of the distance between light emitting points is very small, it is possible to prevent a change of the position of the reflected light Lref focused on a light receiving section (light receiving element for signal light detection 118) according to each optical disc recording and reproduction apparatus. That is, an optical system can be easily designed and the yield of an optical disc recording and reproduction apparatus can be improved.

In addition, the light emitting device 10A of the present embodiment can emit light beams with three wavelengths of around 400 nm, 600 nm band, and 700 nm band. Therefore, the light emitting device 10A of the present embodiment can perform recording and reproduction not only for various known optical discs, such as a Read Only Memory (CD-ROM), a CD-R, a CD-RW, an MD, and a DVD-ROM, but also a Random Access Memory (DVD-RAM), a DVD+RW, or DVD-R/RW, which is currently proposed as a high-capacity rewritable disc, and a next-generation recordable optical disc (for example, an optical disc used in a Digital Video Recorder (DVR) or a Video Disc Recorder (VDR) proposed as a next-generation optical disc apparatus) having a higher surface recording density (for example, 20 G bytes or more). If such next-generation recordable and high-capacity discs can be used, the image data can be recorded and the recorded data (image) can be reproduced with good image quality and operability.

Moreover, although an example where the light emitting device 10A is applied to the optical disc recording and reproduction apparatus has been described herein, the light emitting device 10A can be applied not only to all kinds of optical apparatuses, such as an optical disc reproduction apparatus, an optical disc recording apparatus, a magneto-optical disc apparatus for performing recording and reproduction of a magneto-optical disc (MO), but also to an apparatus including an in-vehicle semiconductor laser device which is required to operate at high temperature.

While the embodiment of the present invention has been described, the present invention is not limited to the above-described embodiment and various modifications may also be made. For example, although the case where the n-type cladding layer 71 to the etching stop layer 74 of the peripheral section 90 are removed has been described in the above embodiment, it is also possible to remove the n-type cladding layer 71 to the etching stop layer 74 and to remove a part of the second substrate 31 in the thickness to form a recess in the second substrate 31. The depth of the recess of the second substrate 31 may be set to about 100 nm, for example.

Moreover, although the case where the embedded layer 91 and the welding layer 40 are provided at the second light emitting element 30 side has been described in the above embodiment, the embedded layer 91 and the welding layer 40 may also be provided at the first light emitting element 20 side, for example.

Moreover, although the support base 11, the first light emitting element 20, and the second light emitting element 30 have been described through specific examples of the laminated structures in the above embodiment, the present invention can also be similarly applied to the case where the support base 11, the first light emitting element 20, and the second light emitting element 30 have other structures. For example, the support base 11 may have only the heat sink 12 without the submount 13.

In addition, although the case where the first and second light emitting elements 20 and 30 are made to emit light beams with different wavelengths has been described in the above embodiment, a plurality of first light emitting elements 20 may be laminated on the one surface side of the support base 11. In addition, it is also possible to laminate a plurality of light emitting elements with different characteristics or structures. In this case, the wavelengths of emitted light beams may be the same or may be different. In the case where a plurality of light emitting elements with different characteristics are laminated, a low-output light emitting element and a high-output light emitting element may be provided together, for example.

In addition, although the case where one light emitting section is provided in the first light emitting element 20 has been described in the above embodiment, the first light emitting element 20 may have a plurality of light emitting sections. Specifically, the first light emitting element 20 may be configured to have a plurality of laser oscillating sections, similar to the second light emitting element 30. In this case, the wavelengths of light beams emitted from the laser oscillating sections may be the same or may be different. In addition, the characteristics or structures may be the same or may be different.

Figure 17:
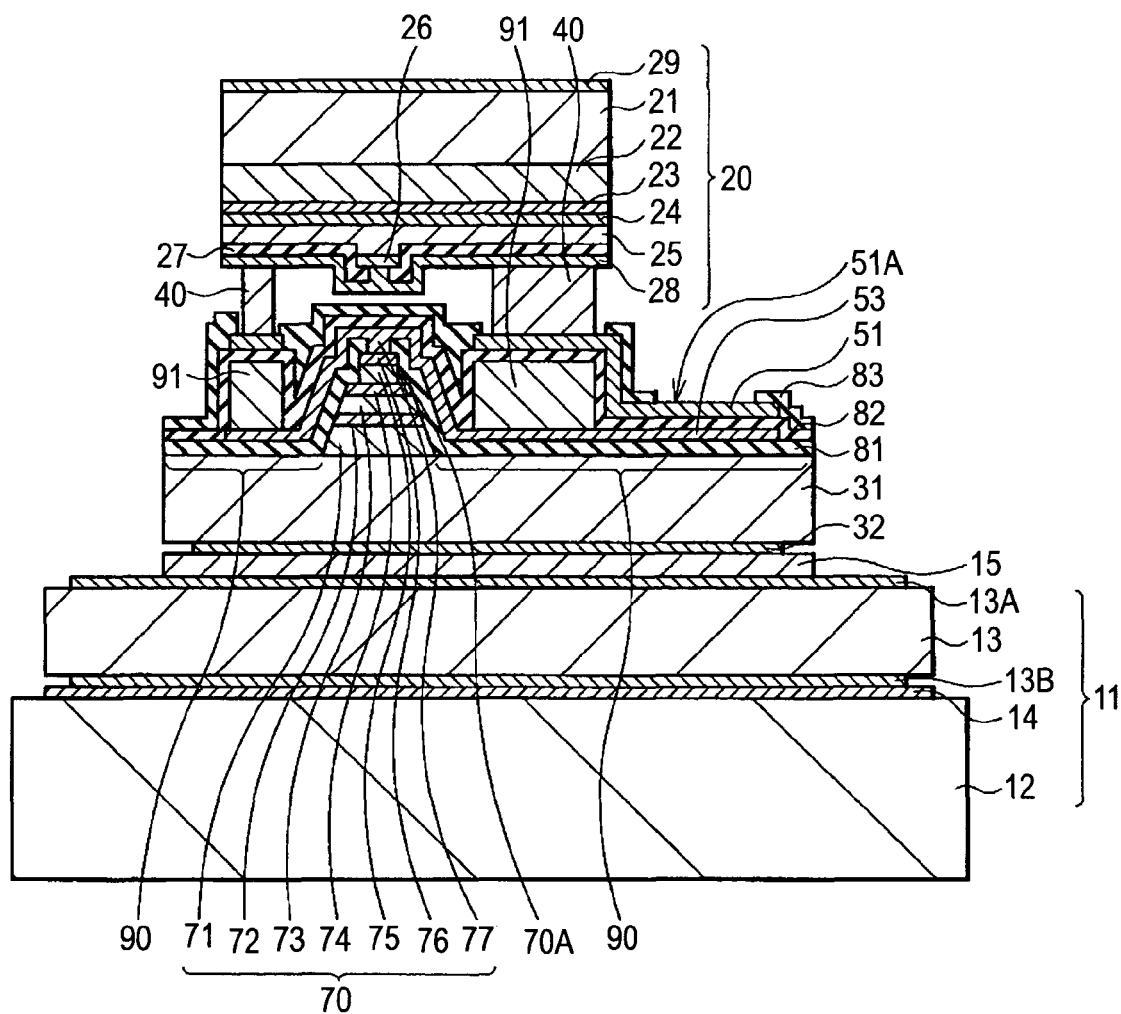
FIG. 17 is a cross-sectional view showing a modification of the light emitting device shown in FIG. 1.

In addition, although the case where the second light emitting element 30 has two laser oscillating sections has been described in the above embodiment, the number of laser oscillating sections of the second light emitting element may be one or may be three or more. For example, as shown in FIG. 17, the light emitting device 10A may be a two-waveform laser in which the second light emitting element 30 has only the laser oscillating section 70. In this case, the wavelengths of emitted light beams, characteristics, and structures of the laser oscillating sections may be the same or may be different.

In addition, although the case where the second light emitting element 30 is formed by a so-called monolithic multi-wavelength laser has been described in the above embodiment, the present invention may also be applied to a case where the second light emitting element is a so-called a hybrid multi-wavelength laser.

In addition, although the specific example of a material used to form the support base 11 has been described in the above embodiment, the support base 11 may also be formed of other materials. In this case, it is preferable that it is a material with high heat conductivity. Moreover, although the heat sink 12 is formed of metal in the above embodiment, it is also possible to form the heat sink 12 using an insulating material and to provide a wiring line thereon, for example.

In addition, although a semiconductor laser has been described as a specific example of a light emitting element in the above embodiment, the present invention may also be applied to light emitting devices including other light emitting elements, such as a light emitting diode (LED).

The present application contains subject matter related to that disclosed in Japanese Priority Patent Application JP 2010-044558 filed in the Japan Patent Office on Mar. 1, 2010, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light emitting device comprising:
   a contact layer of a first light emitting element electrically connected to an electrically-conductive welding layer, said welding layer being between said first light emitting element and an electrically-conductive embedded layer;
   a contact layer of a second light emitting element electrically connected to said embedded layer, said embedded layer being between said second light emitting element and said welding layer,
   wherein said welding layer is electrically isolated from said embedded layer,
   wherein a semiconductor layer in the first light emitting element contains at least one of Group 3B elements and at least nitrogen (N) of group 5B elements.

2. A light emitting device comprising:
   a contact layer of a first light emitting element electrically connected to an electrically conductive welding layer, said welding a layer being between said first light emitting element and an electrically-conductive embedded layer;
   a contact layer of a second light emitting element electrically connected to said embedded layer, said embedded layer being between said second light emitting element and said welding layer,
   a first laser oscillating section on a substrate of the second light emitting element, said first laser oscillating section being configured to emit a first wavelength of light,
   wherein said welding layer is electrically isolated from said embedded layer,
   wherein said substrate of the second light emitting element is formed of gallium arsenide (GaAs).

3. A light emitting device comprising:
   a contact layer of a first light emitting element electrically connected to an electrically-conductive welding layer, said welding layer being between said first light emitting element and an electrically-conductive embedded layer;
   a contact layer of a second light emitting element electrically connected to said embedded layer, said embedded layer being between said second light emitting element and said welding layer,
   a first laser oscillating section on a substrate of the second light emitting element, said first laser oscillating section being configured to emit a first wavelength of light,
   wherein said welding layer is electrically isolated from said embedded layer,
   wherein said substrate of the first light emitting element is formed of nitride-based Group III-V compound semiconductor containing at least one of Group 3B elements and at least nitrogen (N) of Group 5B elements.

4. A light emitting device comprising:
   a contact layer of a first light emitting element electrically connected to an electrically-conductive welding layer, said welding layer being between said first light emitting element and an electrically-conductive embedded layer;

a contact layer of a second light emitting element electrically connected to said embedded layer, said embedded layer being between said second light emitting element and said welding layer, a first laser oscillating section on a substrate of the second light emitting element, said first laser oscillating section being configured to emit a first wavelength of light;

a second laser oscillating section on said substrate of the second light emitting element, said second laser oscillating section being configured to emit a second wavelength of the light, wherein said welding layer is electrically isolated from said embedded layer, and wherein a semiconductor layer in the first light emitting element contains at least one of Group 3B elements and at least nitrogen (N) of group 5B elements.

5. The light emitting device according to claim 4, wherein said second wavelength differs from said first wavelength.

6. The light emitting device according to claim 4, wherein said embedded layer is between a first laser oscillating section of the second light emitting element and said second laser oscillating section of the second light emitting element.

7. The light emitting device according to claim 4, further comprising:
an electrode of the second light emitting element electrically connected to said substrate of the second light emitting element, said second light emitting element being between said first light emitting and said electrode of the second light emitting element.

8. The light emitting device according to claim 1, further comprising:
an electrode of the first light emitting element electrically connected to a substrate of the first light emitting element, said first light emitting element being between said second light emitting and said electrode of the first light emitting element.

9. The light emitting device according to claim 1, further comprising:
a bonding layer between a heat sink and said second light emitting element, said second light emitting element being between said first light emitting and said bonding layer.

10. The light emitting device according to claim 9, further comprising:
a submount between said bonding layer and said heat sink, said submount being bonded to said heat sink and said bonding layer.

11. A light emitting device comprising:
a contact layer of a first light emitting element electrically connected to an electrically-conductive welding layer, said welding layer being between said first light emitting element and an electrically-conductive embedded layer;
a contact layer of a second light emitting element electrically connected to said embedded layer, said embedded layer being between said second light emitting element and said welding layer,
wherein said welding layer is electrically isolated from said embedded layer,
wherein a heat conductivity of the embedded layer is higher than a heat conductivity of a semiconductor layer in the second light emitting element.

12. The light emitting device according to claim 11, wherein said semiconductor layer in the second light emitting element contains at least indium (In) of Group 3B elements and at least phosphorus (P) of Group 5B elements.

13. The light emitting device according to claim 11, wherein said semiconductor layer in the second light emitting element contains at least gallium (Ga) of Group 3B elements and at least arsenic (As) of Group 5B elements.

14. The light emitting device according to claim 1, wherein said first light emitting element is configured to emit a first light beam.

15. The light emitting device according to claim 14, wherein said second light emitting element is configured to emit a second light beam.

16. The light emitting device according to claim 15, wherein a wavelength of the second light beam differs from a wavelength of the first light beam.

17. The light emitting device according to claim 1, wherein said welding layer is electrically connected to a ridge section of the first light emitting element.

18. The light emitting device according to claim 1, wherein said embedded layer is electrically connected to a ridge section of the second light emitting element.

19. The light emitting device according to claim 18, wherein said embedded layer is spaced from said ridge section of the second light emitting element by a distance of less than 30 μm.

20. The light emitting device according to claim 19, wherein said distance is more than 2 μm.

21. The light emitting device according to claim 1, further comprising:
a cladding layer of the first light emitting element physically connected to said contact layer of the first light emitting element, an active layer of the first light emitting element being between said cladding layer of the first light emitting element and another cladding layer of the first light emitting element.

22. The light emitting device according to claim 1, further comprising:
a cladding layer of the second light emitting element physically connected to said contact layer of the second light emitting element, an active layer of the second light emitting element being between said cladding layer of the second light emitting element and another cladding layer of the second light emitting element.

23. An optical apparatus comprising:
the light emitting device according to claim 1, said light emitting device being configured to emit outgoing light;
an optical system configured to guide said outgoing light onto an optical disc.

* * * * *